(12) United States Patent
Hu et al.

(10) Patent No.: US 10,818,681 B2
(45) Date of Patent: Oct. 27, 2020

(54) TERMINATION STRUCTURES IN STACKED MEMORY ARRAYS

(71) Applicant: Micron Technology Inc., Boise, ID (US)

(72) Inventors: Yi Hu, Boise, ID (US); Jian Li, Boise, ID (US); Lifang Xu, Boise, ID (US); Xiaosong Zhang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 16/160,342

(22) Filed: Oct. 15, 2018

(65) Prior Publication Data

US 2020/0119032 A1    Apr. 16, 2020

(51) Int. Cl.
*H01L 27/11565* (2017.01)
*H01L 21/768* (2006.01)
*H01L 27/11582* (2017.01)

(52) U.S. Cl.
CPC .. *H01L 27/11565* (2013.01); *H01L 21/76802* (2013.01); *H01L 21/76877* (2013.01); *H01L 27/11582* (2013.01)

(58) Field of Classification Search
CPC ......... H01L 27/11565; H01L 27/11573; H01L 27/11575; H01L 27/11578–11582
See application file for complete search history.

(56) References Cited

U.S. PATENT DOCUMENTS

| | | |
|---|---|---|
| 9,773,805 B1 | 9/2017 | Li et al. |
| 2012/0208347 A1 | 8/2012 | Hwang et al. |
| 2017/0250108 A1 | 8/2017 | Mathew et al. |

OTHER PUBLICATIONS

U.S. Appl. No. 16/029,144, entitled "Integrated Assemblies Having Thicker Semiconductor Material Along One Region of a Conductive Structure Than Along Another Region, and Methods of Forming Integrated Assemblies", filed Jul. 6, 2018, (63 pgs.).
U.S. Appl. No. 15/992,959, entitled "Arrays of Elevationally-Extending Strings of Memory Cells and Methods of Forming an Array of Elevationally-Extending Strings of Memory Cells", filed May 30, 2018, (41 pgs.).
U.S. Appl. No. 15/710,432, entitled "Methods Used in Forming an Array of Elevationally-Extending Transistors" filed Sep. 20, 2017, (56 pgs.).

*Primary Examiner* — Robert G Bachner
*Assistant Examiner* — Molly K Reida
(74) *Attorney, Agent, or Firm* — Brooks, Cameron & Huebsch, PLLC

(57) ABSTRACT

In an example, a method of forming a stacked memory array includes, forming a termination structure passing through a stack of alternating first and second dielectrics in a first region of the stack; forming first and second sets of contacts through the stack of alternating first and second dielectrics in a second region of the stack concurrently with forming the termination structure; forming an opening through the stack of alternating first and second dielectrics between the first and second sets of contacts so that the opening terminates at the termination structure; and removing the first dielectrics from the second region by accessing the first dielectrics through the opening so that the first and second sets of contacts pass through the second dielectrics alternating with spaces corresponding to the removed first dielectrics.

24 Claims, 18 Drawing Sheets

US 10,818,681 B2

TERMINATION STRUCTURES IN STACKED MEMORY ARRAYS

TECHNICAL FIELD

The present disclosure relates generally to memory arrays and their formation, and more particularly, to termination structures in stacked memory arrays.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory (e.g., RRAM), and Flash memory, among others.

Memory devices can be utilized as volatile and non-volatile data storage for a wide range of electronic applications. Volatile memory may require power to maintain its data, whereas non-volatile memory may provide persistent data by retaining stored data when not powered. Flash memory, which is just one type of non-volatile memory, can use a one-transistor memory cells that allow for high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices. Memory cells can be arranged into arrays, with the arrays being used in memory devices.

Memory devices can have arrays of memory cells. Memory arrays can include groups of memory cells, such as blocks, sub-blocks, strings, etc. In some examples, a memory array can be a stacked memory array that can be referred to as a three-dimensional (3D) memory array. The memory cells at a common location (e.g., at a common vertical level) in a stacked memory array, for example, may form a tier of memory cells. The memory cells in each tier can be commonly coupled to a common access line, such as a word line. In some examples, a group of memory cells can include memory cells from different tiers coupled in series to form a string of series coupled memory cells (e.g., a NAND string) between a select transistor coupled to a source and a select transistor coupled to a data line, such as a bit line.

In some examples, the formation of stacked memory arrays can include a replacement gate process. After semiconductor structures (e.g., semiconductor pillars) are formed through a stack of alternating dielectrics, a replacement gate process can be used to remove dielectrics from the stack at levels at which memory cells are to be formed adjacent to the semiconductor structures and to form conductive access lines (e.g., metal access lines) in place of the removed dielectrics. In various examples, an opening (e.g., slot) can be formed through the stack to provide access to the various levels in the stack in order to remove selected dielectric material layers (e.g., via an etchant) and replace them with conductive material (e.g., a metal) levels, which can serve as the access lines.

DETAILED DESCRIPTION

Figure 1:
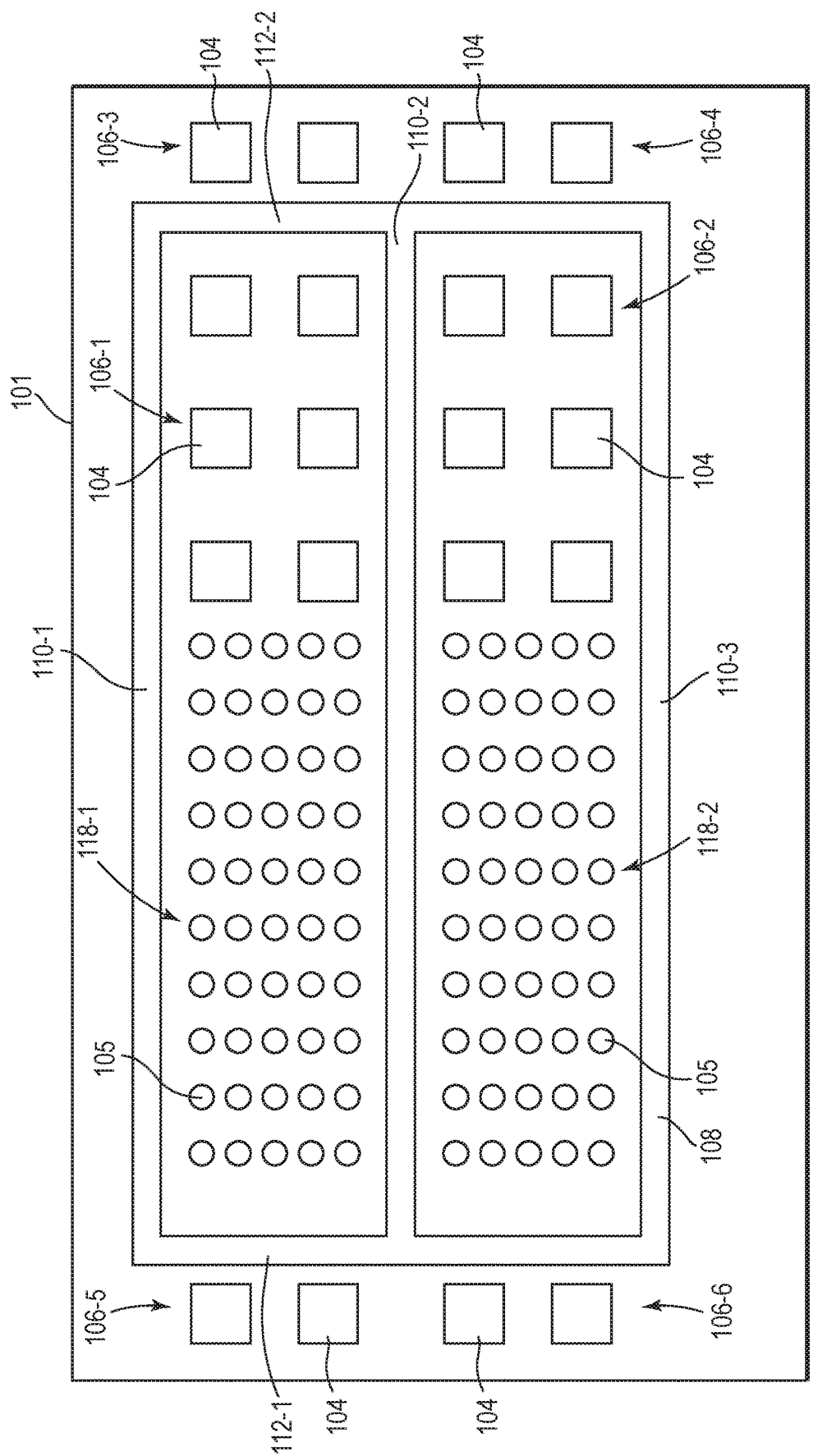
FIG. 1 is a top view at a particular processing stage associated with forming a stacked memory array, according to the background art.

Stacked memory arrays and their formation are disclosed herein. In an example method to form a stacked memory array, a termination structure and first and second sets of contacts can be formed concurrently through a stack of alternating first and second dielectrics. For example, the first dielectrics can be at levels in the stack at which memory cells are to be formed adjacent to semiconductor structures passing through the stack. An opening can be formed between the first and second sets of contacts so that the opening terminates at the termination structure. The opening can provide access to the stack during subsequent processing that can occur during a replacement gate process.

In previous approaches, the openings (e.g., slots) used to access the alternating dielectrics can be formed (e.g., concurrently) by a single etch through the dielectric stack in a first direction and in a second (e.g., transverse) direction, which facilitates electrical isolation of blocks of memory cells from each other after the openings are filled with a dielectric. The transverse etch through the stack forms "T-intersections" that can be difficult to form and that can have various drawbacks. Various embodiments of the present disclosure can utilize termination structure that can help isolate the blocks of memory cells from each other without forming "T-intersections," thereby avoiding the difficulties and drawbacks associated therewith. A block of memory cells can be a group of memory cells that is commonly erased, for example.

Forming the termination structure concurrently with the sets of contacts can result in a reduction of the movement of the semiconductor structures during the formation of the opening compared to previous approaches that form an opening between the sets of contacts concurrently with forming a transverse opening transverse to the opening between the sets of contacts to form a T-intersection. For example, excessive movement of the semiconductor structures can make it difficult to align data line contacts with the semiconductor structures during subsequent processing. Moreover, forming the termination structure concurrently with the sets of contacts before forming the opening can mitigate difficulties associated with the T-intersection that forms while forming the opening between the sets of contacts and the transverse opening concurrently.

In some examples, first and second termination structures can be formed through a stack of alternating first and second dielectrics in a first region of the stack so that a segment of the stack separates the first termination structure from the second termination structure. A set of contacts can be formed through the stack in a second region of the stack concurrently with forming the first and second termination structures. A group of semiconductor structures can be formed through the alternating first and second dielectrics in a third region of the stack before the first and second termination structures and the set of contacts are formed. Second and third openings can be formed through the stack of alternating first and second dielectrics so that the second and third openings respectively terminate at the first and second termination structures and the set of contacts and the group of semiconductor structures are between the second and third openings.

The segment can couple the alternating first and second dielectrics in the first region to the alternating first and second dielectrics in the second and third regions while the opening is formed. The coupling can reduce the amount of movement of the semiconductor structures compared to previous approaches that form the first and second openings concurrently with forming a transverse opening in the first region transverse to the first and second openings that can decouple the first region from the second and third regions.

FIG. 1 is a top view at a particular processing stage associated with forming a stacked memory array, according to the background art. In FIG. 1, a stack 101 of alternating dielectrics, such as nitride alternating with oxide, includes sets 106-1 to 106-6 of contacts 104 passing through stack 101 and groups 118-1 and 118-2 of semiconductor structures 105 passing through stack 101.

Contacts 104 can be formed after semiconductor structures 105 are formed. In some examples, memory cells can be partially formed adjacent to semiconductor structures 105 (e.g., at levels in stack 101 containing the nitride) before contacts 104 are formed.

An opening 108 is formed through stack 101 after contacts 104 are formed. In some examples, a removal material selective to nitride can be supplied through opening 108 to remove the nitride, leaving the oxide. Contacts 104 can be electrical contacts and/or support contacts. For example, the electrical contacts can be coupled to routing circuitry of the array. The electrical and support contacts can provide support that acts to stabilize and restrict movement of stack 101 during and after the removal of the nitride.

In some examples, the partially formed memory cells can be completed by accessing the memory cells through opening 108. Metal, such as tungsten, can be supplied though opening 108 to form lines, such as access lines that can be coupled to the memory cells and that can extend into the regions including sets 106-1 and 106-2 of contacts 104 so that the contacts 104 of sets 106-1 and 106-2 pass through oxide alternating with metal, for example. For instance, access lines corresponding to group 118-1 can extend into the region including set 106-1, and access lines corresponding to group 118-2 can extend into the region including set 106-2. In some examples, formation of opening 108, removal of the nitride, completing the memory cells, and forming the access lines can be formed as part of a replacement gate process.

A dielectric can be formed in opening 108 to electrically isolate the access lines corresponding to group 118-1 from access lines corresponding to group 118-2. Opening 108 can include segments 110-1 to 110-3 and segments 112-1 and 112-2 that are transverse to segments 110-1 to 110-3. For example, segments 110-1 to 110-3 and segment 112-1 form respective T-intersections, and segments 110-1 to 110-3 and segment 112-2 form respective T-intersections.

In some examples, opening 108 can be formed during a single process step (e.g., during a single etch) that can form the segments 110-1 to 110-3 and segments 112-1 and 112-2 of opening 108 concurrently. However, as an example, the T-intersections can be formed by performing a first etch through the stack 101 to form segments 110-1 to 110-3 and a second etch through the stack 101 to form segments 112-1 and 112-2. Forming such "T-intersections" can be difficult and can have various drawbacks. For instance, forming segments 112-1 and 112-2 can result in over etching or under etching, which can result in inadequate separation of the groups 118-1 and 118-2 or can prevent adequate electrical isolation.

Segment 112-1 can form a continuous space (e.g., discontinuity) in stack 101 that can decouple the region having sets 106-5 and 106-6 from the ends of groups 118-1 and 118-2. Segment 112-2 can form a continuous space in stack 101 that can decouple the region having sets 106-3 and 106-4 from the ends of sets 106-1 and 106-2. In some examples, stress in stack 101 that can occur as a result of processing prior to the formation of opening 108 can be released during the formation of opening 108, especially as a result of the formation segments 112-1 and 112-2. For example, semiconductor structures 105 can move after opening 108 is formed due to the stress release, especially in a direction parallel to segments 110 in the regions adjacent to segments 112-1 and 112-2, as a result of the discontinuities caused by segments 112-1 and 112-2. Moreover, the discontinuities can result in additional movement during the removal of the nitride and/or during the formation of the access lines.

The movement can make it difficult to align data line contacts with semiconductor structures 105, such as to couple data lines to the semiconductor structures 105. In some instances, the movement of semiconductor structures 105 can be relatively large at and near the ends of the ends of groups 118-1 and 118-2 and relatively little away from the ends. As such, the memory cells adjacent to the semiconductor structures 105 at and near the ends of groups 118-1 and 118-2 can be "dummy" memory cells. However, this can reduce the total number of memory cells available for data storage.

Figure 2A:
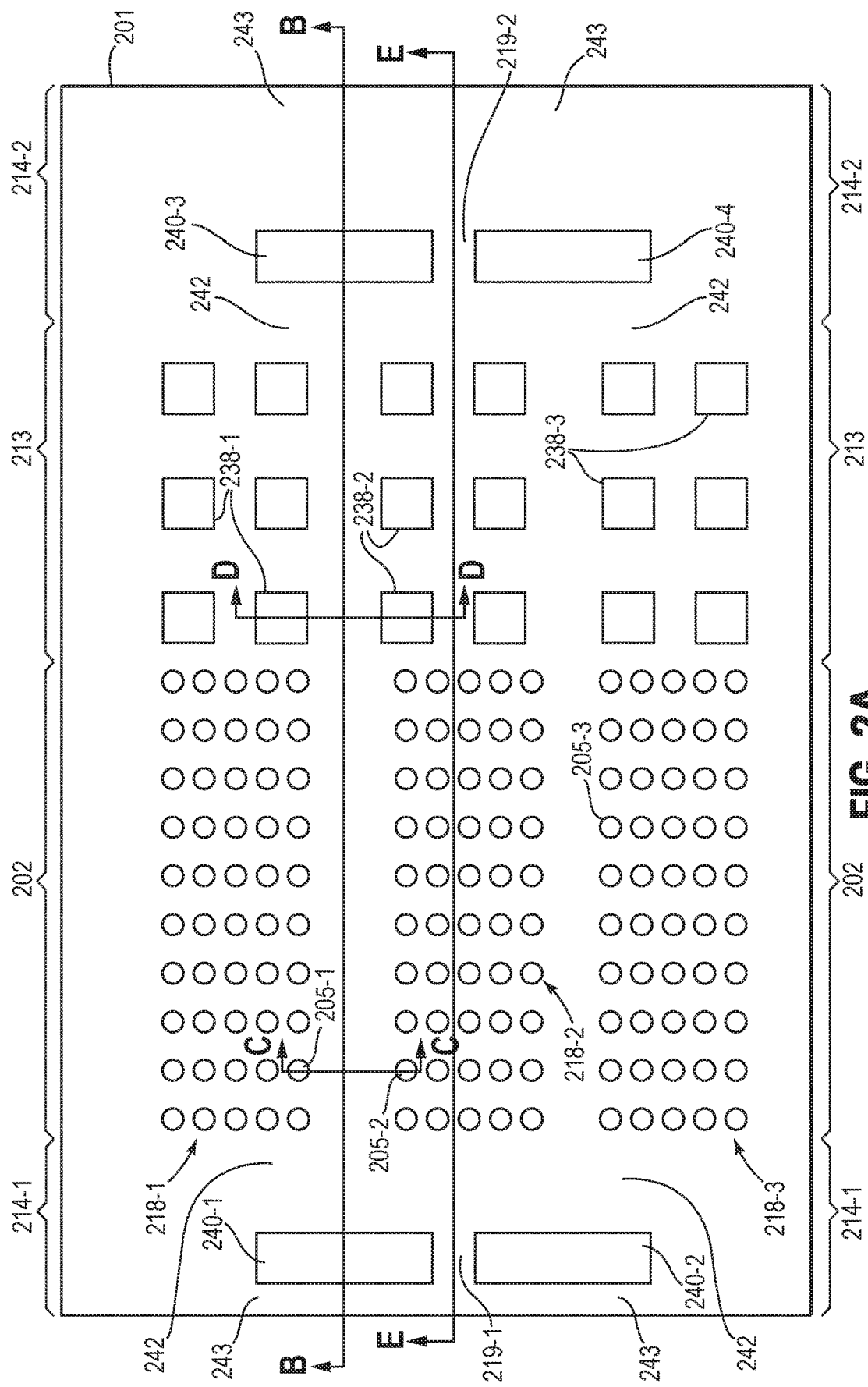
FIGS. 2A to 2M are various views corresponding to particular stages of processing associated with forming a stacked memory array in accordance with a number of embodiments of the present disclosure.
Figure 2B:
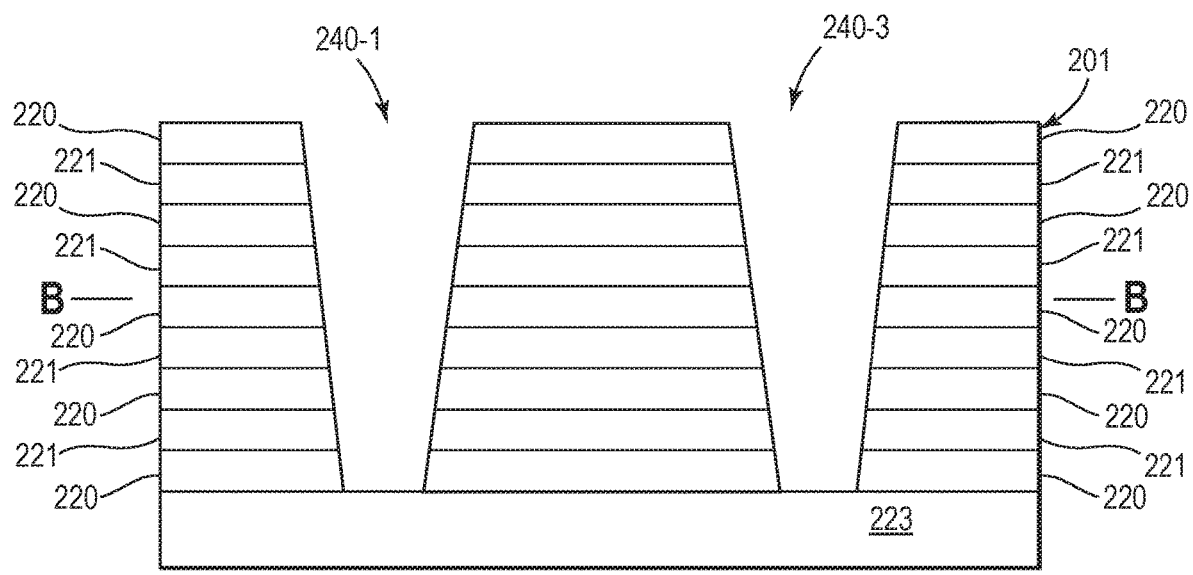
Figure 2C:
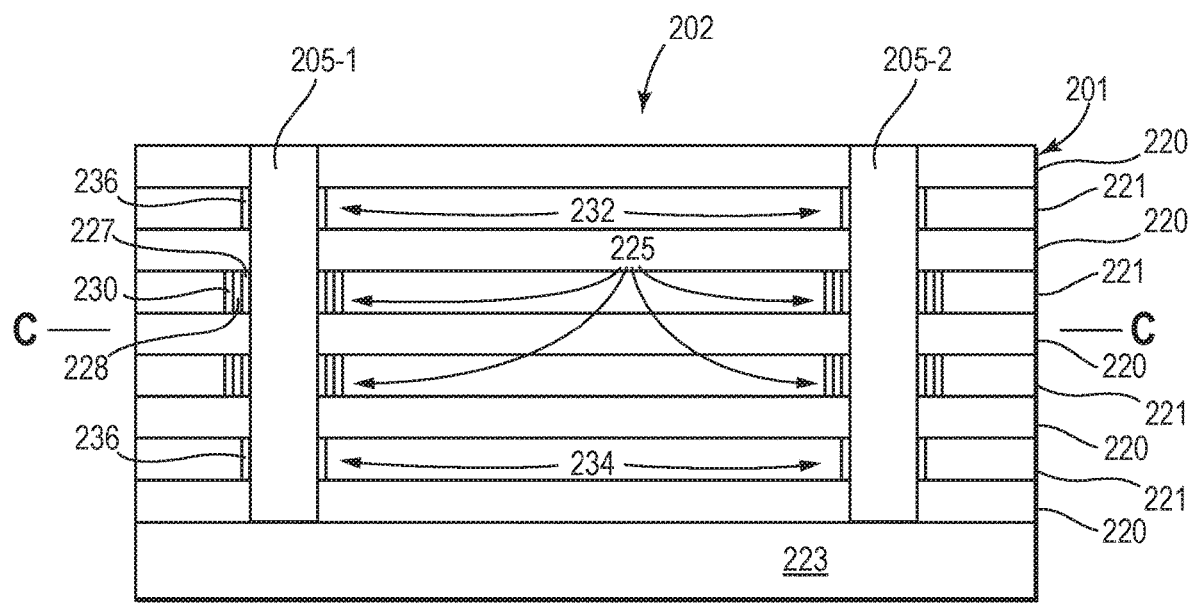
Figure 2D:
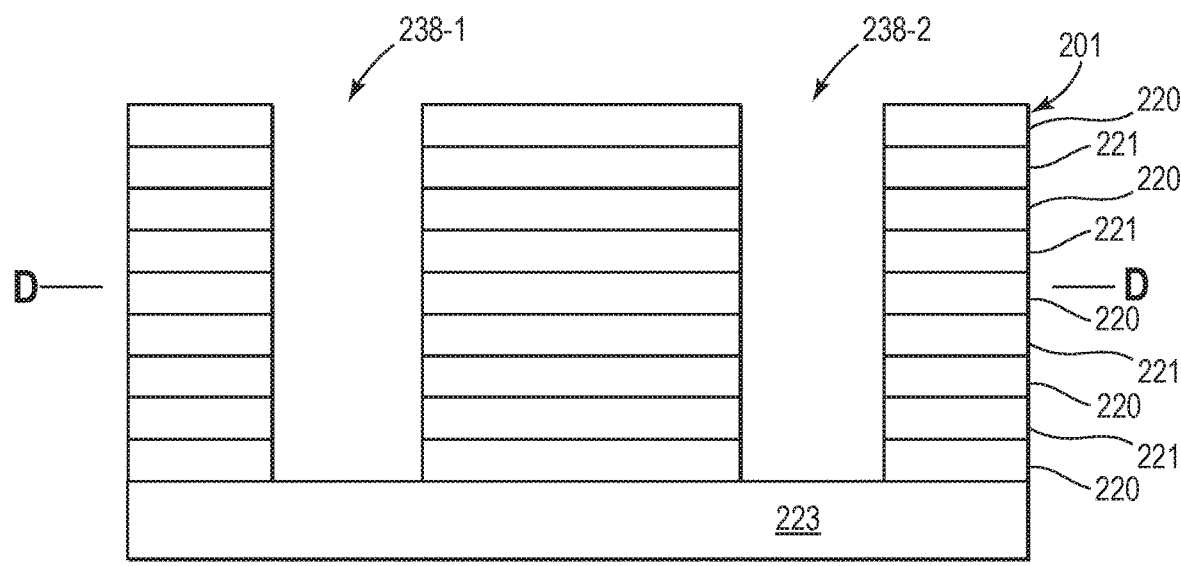
Figure 2E:
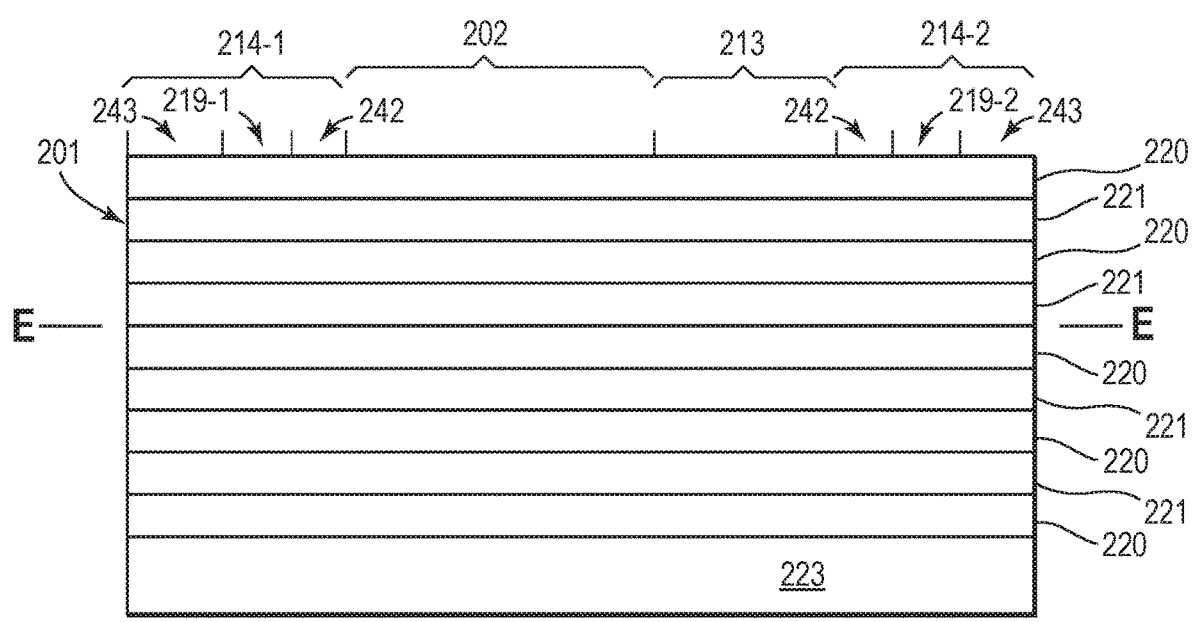

FIG. 2A is a top view corresponding to a particular stage of processing associated with forming a stacked memory array in accordance with a number of embodiments of the present disclosure. In some examples, the array can be a three-dimensional NAND memory array. FIG. 2B is a cross-section viewed along line B-B in FIG. 2A during the processing stage in FIG. 2A in accordance with a number of embodiments of the present disclosure. FIG. 2C is a cross-section viewed along line C-C in FIG. 2A during the processing stage in FIG. 2A in accordance with a number of embodiments of the present disclosure. FIG. 2D is a cross-section viewed along line D-D in FIG. 2A during the processing stage in FIG. 2A in accordance with a number of embodiments of the present disclosure. FIG. 2E is a cross-section viewed along line E-E in FIG. 2A during the processing stage in FIG. 2A in accordance with a number of embodiments of the present disclosure. FIGS. 2A-2E can correspond to a processing stage that can occur after a number of processing stages have occurred. In some examples, a processing stage can include a number of steps that can have a number of sub-steps.

A group 218-1 of semiconductor structures 205-1 passes through a region 202 of a stack 201 of alternating dielectrics 220 and 221 formed on (e.g., over) a semiconductor 223. A group 218-2 of semiconductor structures 205-2 passes through region 202, and a group 218-3 of semiconductor structures 205-3 passes through region 202. In some examples, groups 218-1 to 218-3 can correspond to blocks of memory cells that are to be formed in region 202, and region 202 can be referred to as a memory-cell region.

Semiconductor structures 205-1 to 205-3 and semiconductor 223 can be polysilicon, silicon conductively doped to have a p-type conductivity (e.g., single crystal p' silicon), or the like. Dielectrics 220 can be oxide, and dielectrics 221 can be nitride.

In some examples, memory cells 225 can be partially formed adjacent to each semiconductor structure 205 at levels of stack 201 having dielectric 221. For example, as shown in FIG. 2C, a tunnel dielectric 227 (e.g., tunnel oxide) of a memory cell 225 can be formed adjacent to a semiconductor structure 205; a charge storage structure 228 (e.g., a charge trap, floating gate, etc.) can be formed adjacent to the tunnel dielectric 227; and a blocking dielectric 230 (e.g., oxide) can be formed adjacent to the charge storage structure 228. A dielectric 221 can be adjacent to the blocking dielectric 230. In some examples, tunnel dielectric 227, charge storage structure 228, and blocking dielectric 230 can wrap completely around (e.g., completely surround) the corresponding semiconductor structure 205.

In some examples, as shown in FIG. 2C, a select transistor 232 can be partially formed adjacent to each semiconductor structure 205 at a level of stack 201 having an uppermost dielectric 221, and a select transistor 234 can be partially formed adjacent to each semiconductor structure 205 at a level of stack 201 having a lowermost dielectric 221. For example, a gate dielectric 236 (e.g., gate oxide) of select transistors 232 and 234 can be formed adjacent to each semiconductor structure 205. A dielectric 221 can be adjacent to gate dielectrics 236. In some examples, gate dielectric 236 can wrap completely around the corresponding semiconductor structure 225. Note that semiconductor structures 205 can be formed prior to the processing stage depicted in FIGS. 2A to 2E, and select transistors 232 and 234 and memory cells 225 can be partially formed prior to the processing stage depicted in FIGS. 2A to 2E.

In some examples, stack 201 can include a stair-step structure (not shown in FIG. 2A) adjacent to region 214-1 and/or region 214-2. Respective steps of the stair-step structure can be at different levels in stack 201. Each step of the stair-step structure can include a dielectric 221 over a dielectric 220, for example.

In the processing stage corresponding to FIGS. 2A to 2E, sets of openings 238-1 to 238-3, such as contact openings, are formed (e.g., etched) through stack 201 in a region 213, such as a contact region, of stack 201, stopping at an upper surface of or in semiconductor 223. Openings 240 (e.g., openings 240-1 to 240-4), such as termination openings, are formed (e.g., etched) through stack 201 concurrently with forming openings 238-1 to 238-3, stopping at an upper surface of or in semiconductor 223. For example, openings 240-1 and 214-2 can be formed through stack 201 in a region 214-1 of stack 201 adjacent to region 202, and openings 240-3 and 214-4 can be formed through stack 201 in a region 214-2 of stack 201 adjacent to region 213.

A segment 219-1 of region 214-1 is between adjacent openings 240-1 and 240-2, and a segment 219-2 of region 214-2 is between adjacent openings 240-3 and 240-3. Openings 240 can be between portions 242 and 243 of stack 201 in regions 214. As shown in FIG. 2A, a portion 242 can extend from openings 240-1 and 240-2 in region 214-1 into region 202, and a portion 242 can extend from openings 240-3 and 240-4 in region 214-2 into region 213. Portions 243 can be bulk portions of regions 214-1 and 214-2 of alternating dielectrics 220 and 221.

Note that segment 219-1 couples a portion 243 to a portion 242, and thus region 214-1 to region 202, and segment 219-2 couples a portion 243 to a portion 242, and thus region 214-2 to region 213. For example, the portion of stack 201 depicted in FIG. 2E is continuous from end to end. Segments 219 maintain couplings between region 214-1 and region 202 and between region 214-2 and region 213, and thus the continuous structure, while openings 240 are formed. This avoids the continuous discontinuities in the stack 101 resulting from segments 112-1 and 112-2 in FIG. 1. For example, the couplings afforded by segments 219 can reduce the amount of movement of semiconductor structures 205 associated with the formation of openings 240 relative to the movement of semiconductor structures 105 associated with the formation of segments 112-1 and 112-2. For example, the movement in a direction parallel to line E-E of semiconductor structures 205 as a result of forming openings 240 can be about 90 percent less than the movement in a direction parallel to segments 110 in FIG. 1 as a result of forming segments 112-1 and 112-2.

Figure 2F:
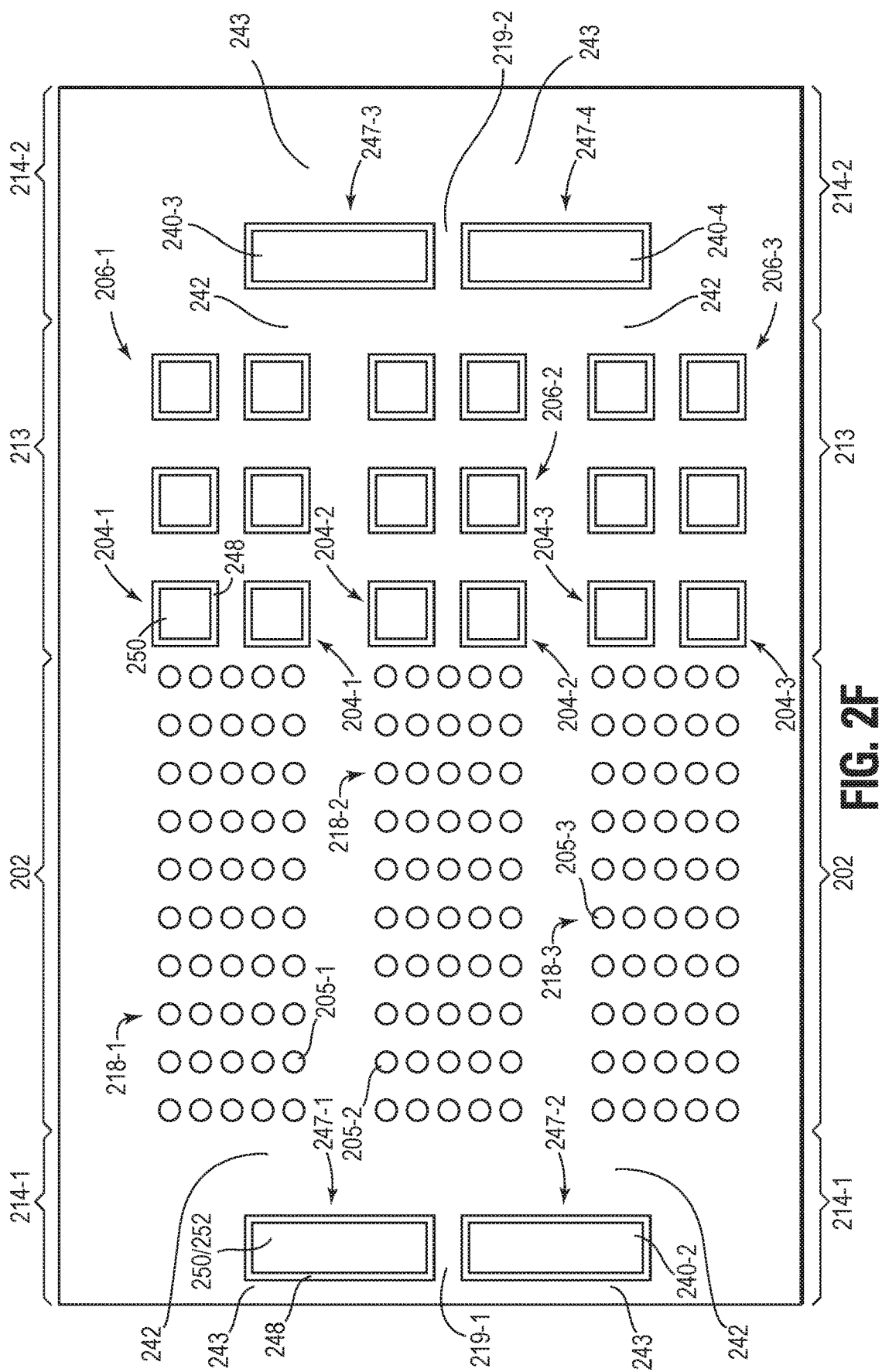

FIG. 2F is a top view corresponding to a stage of processing following the stage of processing of FIG. 2A in accordance with a number of embodiments of the present disclosure. During the processing stage of FIG. 2F, contacts 204-1 to 204-3 are respectively formed through stack 201 in the openings 238-1 to 238-3 in region 213 so that contacts 204-1 to 204-3 are respectively form sets 206-1 to 206-3 of contacts. Adjacent termination structures 247-1 and 247-2 are formed through stack 201 in the openings 240-1 and 240-2 in region 214-1 concurrently with forming contacts 204-1 to 204-3, and adjacent termination structures 247-3 and 247-4 are formed through stack 201 in the openings 240-3 and 240-4 in region 214-2 concurrently with forming contacts 204-1 to 204-3. Segment 219-1 is between termination structures 247-1 and 247-2 and couples region 214-1 to region 202. Segment 219-2 is between termination structures 247-1 and 247-2 and couples region 214-2 to region 213. Termination structures 247 can be between portions 242 and 243.

In some examples, forming contacts 204 and termination structures 247 can include concurrently forming dielectric liners 248, such as oxide liners, in openings 238 and in openings 240. A conductive material 250 (e.g., a metal such as tungsten) is formed in the openings lined with the dielectric liners 248 adjacent to dielectric liners 248, so that the dielectric liners 248 surround material 250. For example, metal 250 is formed in the openings 238 lined with dielectric liners 248 concurrently with forming metal 250 in the openings 240 lined with dielectric liners 248. For example, contacts 204 and termination structures 247 can include metal 250 surrounded by a dielectric liner 248.

In some examples, metal 250 can be removed from termination structures 247 and replaced with a dielectric 252, such as oxide. For example, dielectric 252 can be formed adjacent to dielectric liners 248. As such, in some embodiments, termination structures 247 can include dielectric 252 surrounded by a dielectric liner 248.

Figure 2G:
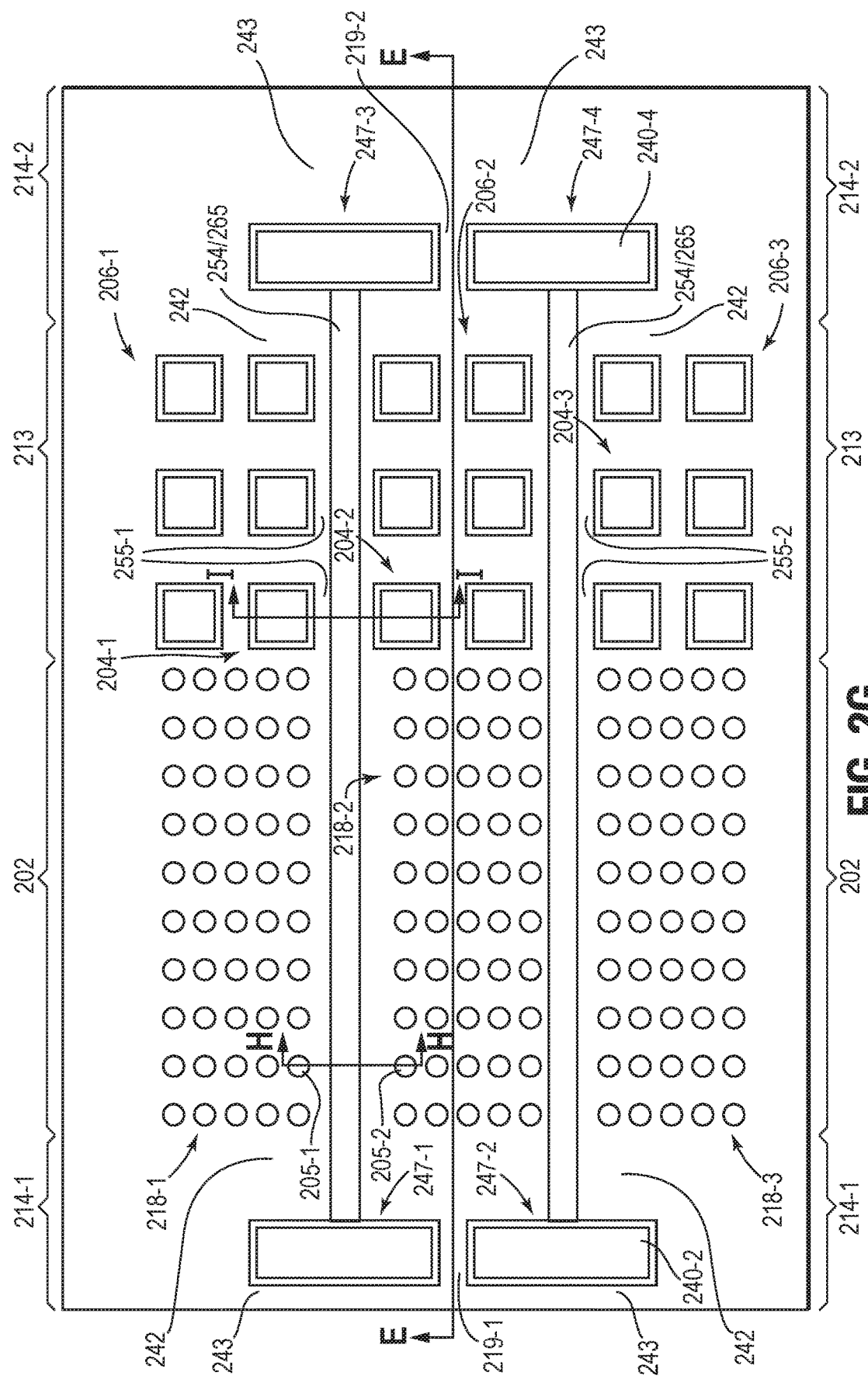

FIG. 2G is a top view corresponding to a stage of processing following the stage of processing of FIG. 2F in accordance with a number of embodiments of the present disclosure. In FIG. 2G, an opening 254 is formed through stack 201 in a region 255-1 between the sets 206-1 and 206-2 of contacts and between the groups 218-1 and 218-2 of semiconductor structures, and an opening 254 is formed in a region 255-2 between the sets 206-2 and 206-3 of contacts and between the groups 218-2 and 218-3 of semiconductor structures. For example, openings 254 can pass through stack 201 and stop at an upper surface of or in semiconductor 223. Openings 254 can be performed as part of a replacement gate process in some examples.

An opening 254 is between and terminates at termination structures 247-1 and 247-3, and an opening 254 is between and terminates at termination structures 247-2 and 247-4. For example, openings 254 may terminate at the oxide liners 248 without passing through oxide liners 248. Openings 254 can provide access to alternating dielectrics 220 and 221 and to the groups 218-1-218-3.

Portions of termination structures 247 can be between portions 242 and 243 and can couple the alternating dielectrics 220 and 221 in portion 242 to the alternating dielectrics 220 and 221 in portion 243. As shown in FIG. 2G, a portion 242 can extend from portions of termination structures 247-1 and 247-2 in region 214-1 into region 202, and a portion 242 can extend from a portion of termination structures 247-3 and 247-4 in region 214-2 into region 213. As described previously in conjunction with FIG. 2A, portions 243 can be bulk portions of regions 214-1 and 214-2. As such, termination structures 247-1 and 247-2 are between and couple region 202 to the bulk portion 243 of region 214-1 and termination structures 247-3 and 247-4 are between and couple region 213 to the bulk portion 243 of region 214-2.

Note that segment 219-1 couples region 214-1 to region 202 and segment 219-2 couples region 214-2 to region 213 while openings 254 are formed. This can reduce the amount of movement of semiconductor structures associated with the formation of openings 254 compared to the amount of movement associated with the formation segments 112-1 and 112-2 in FIG. 1.

Openings 254 can be analogous to the segments 110 of opening 108 in FIG. 1. However, termination structures 247-1 and 247-2 separated by segment 219-1 in region 214-1 have replaced segment 112-1 of opening 108, and termination structures 247-3 and 247-4 separated by segment 219-2 in region 214-2 have replaced segment 112-2 of opening 108. As such, the movement in a direction parallel to openings 254 as a result of forming openings 254 can be less than the movement in a direction parallel to segments 110 in FIG. 1 as a result of forming opening 108. Moreover, forming openings 254 after forming termination structures 247 can avoid the difficulties associated with forming the T-intersections between segments 110 and segments 112-1 and 112-2 that can occur when forming opening 108 during a single etch.

Figure 2H:
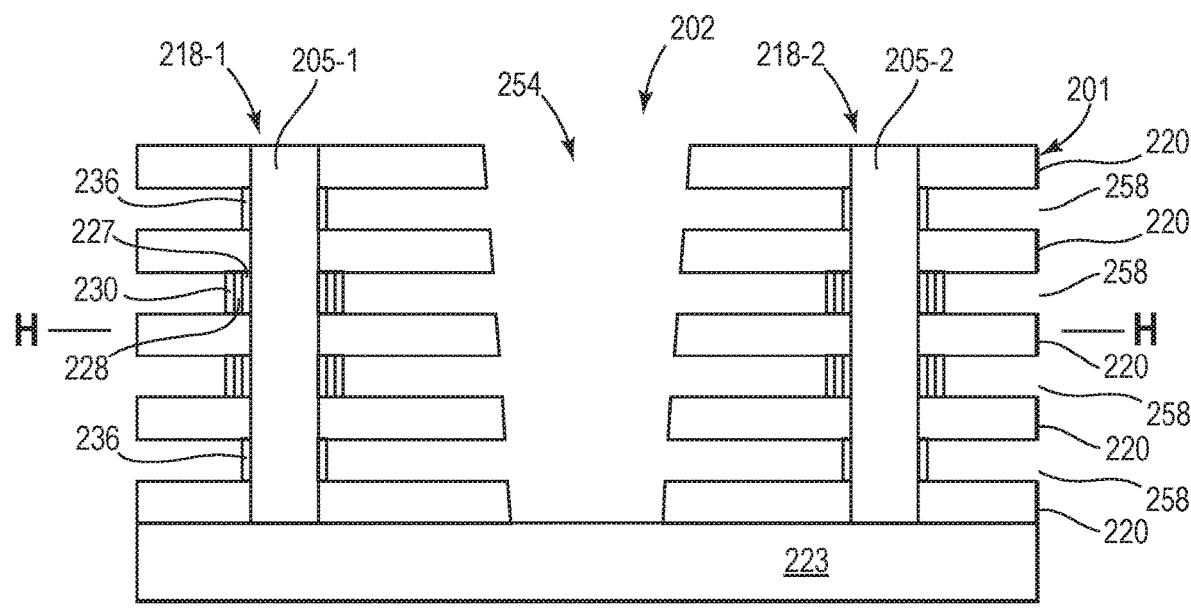
Figure 2I:
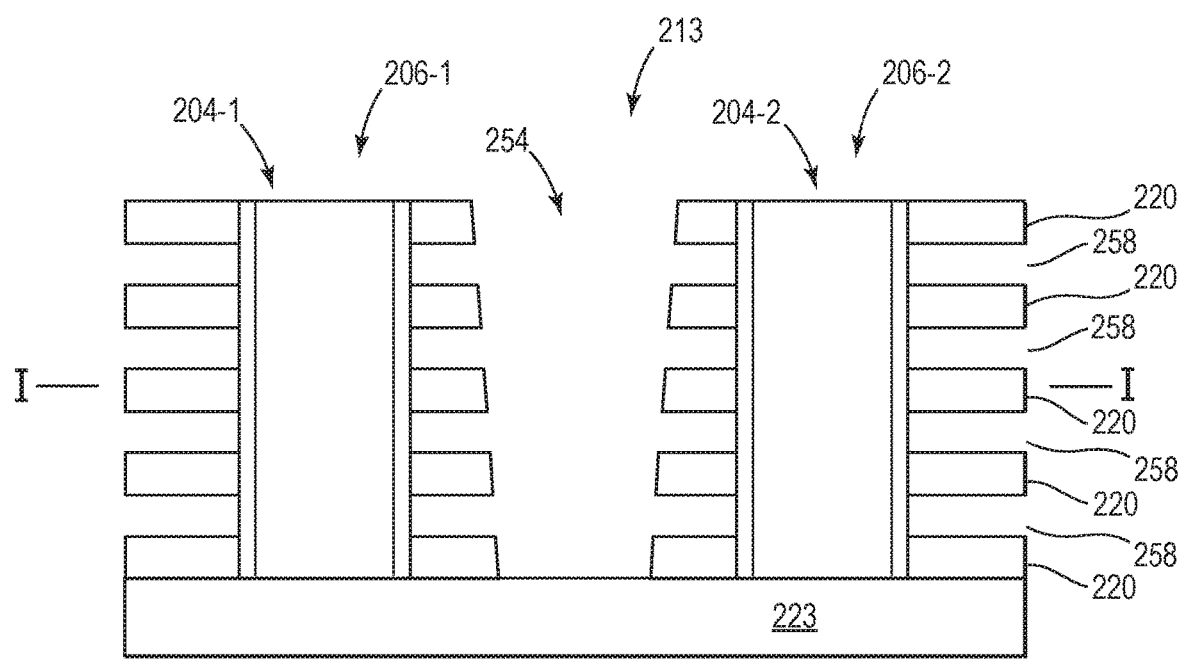

FIG. 2H is a cross-section viewed along line H-H in FIG. 2G during a subsequent processing step of the processing stage in FIG. 2G in accordance with a number of embodiments of the present disclosure. FIG. 2I is a cross-section viewed along line I-I in FIG. 2G during the processing step of FIG. 2H in accordance with a number of embodiments of the present disclosure.

Openings 254 can provide access to dielectrics 221 for the removal of dielectrics 221. For example, dielectrics 221 can be removed as part of a replacement gate process. A removal material, such as a wet etchant, can be supplied through openings 254 to remove dielectrics 221 to form a stack of dielectrics 220 alternating with spaces 258 in region 202, as shown in FIG. 2H, so that the groups 218-1 and 218-2 of semiconductor structures pass through dielectrics 220 alternating with spaces 258. Note that the uppermost and lowermost spaces 258 expose the gate dielectrics 236, and the spaces 258 between the uppermost and lowermost spaces 258 expose the blocking dielectrics 230. For example, semiconductor structures 205-1 and 205-2 pass through the stack of dielectrics 220 alternating with spaces 258 in region 202. The removal material supplied through openings 254 removes dielectrics 221 from region 213 so that contacts 204-1 and 204-2 pass through the stack of dielectrics 220 alternating with spaces 258 in region 213, as shown in FIG. 2I.

Figure 2J:
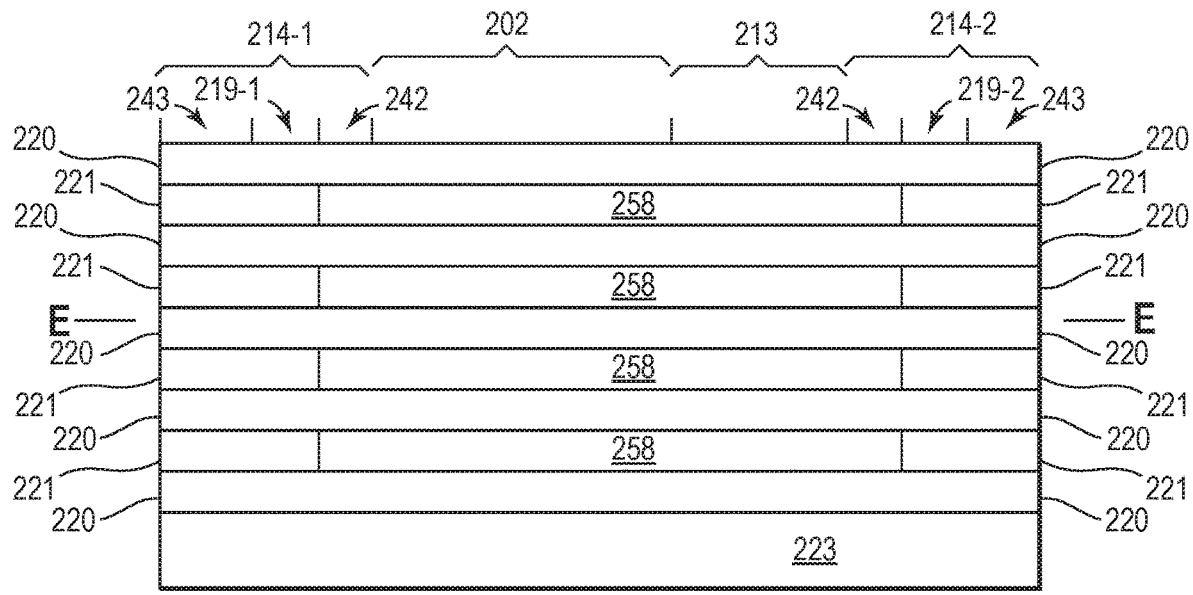

FIG. 2J is a cross-section viewed along line E-E in FIG. 2G, corresponding to the processing step of FIGS. 2H and 2I in accordance with a number of embodiments of the present disclosure. As shown in FIG. 2J, dielectrics 221 are not removed from the bulk portions 243 of regions 214-1 and 214-2. In some examples, the removal material can flow into portions 242 of regions 214-1 and 214-2 and can remove dielectrics 221 to form spaces 258 in portions 242 of regions 214-1 and 214-2 up to termination structures 247 and up to portions of segments 219-1 and 219-2. However, termination structures 247 can be wide enough in a direction transverse to openings 254 so that the removal material is prevented from flowing around the ends of termination structures and into the bulk portions 243 of regions 214-1 and 214-2. Moreover, the distance (e.g., the extent of segments 219) between adjacent termination structures, such as between termination structures 247-1 and 247-2 and between 247-3 and 247-4, can be such that the not all of dielectrics 221 are removed from segments 219, as shown in FIG. 2J.

Figure 3:
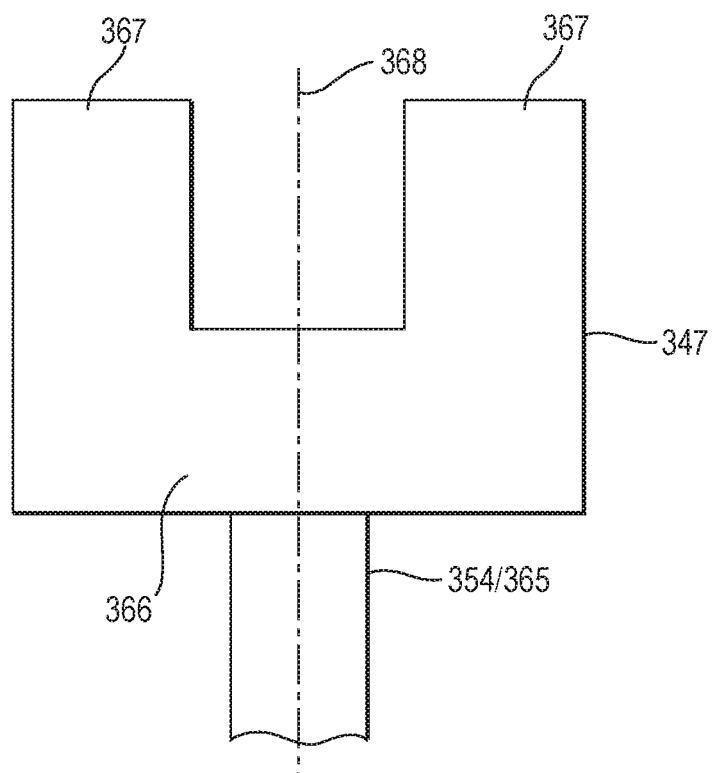
FIG. 3 illustrates a termination structure in accordance with a number of embodiments of the present disclosure.
Figure 4:
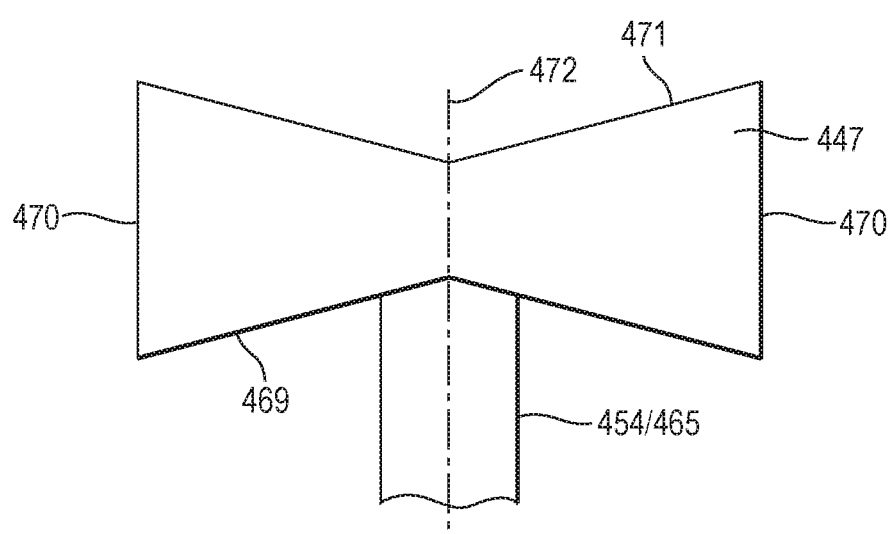
FIG. 4 illustrates another termination structure in accordance with a number of embodiments of the present disclosure.

Each termination structure 247 can be rectangular (e.g., have a rectangular cross-section) so that the long sides of the respective termination structure are transverse to a respective opening 254. In some examples, the termination structures can have other shapes, such as shown in FIGS. 3 and 4. For example, an opening 254 can terminate at one of the long sides of a termination structure 247.

Note that after the removal of dielectrics 221, segment 219-1 couples alternating dielectrics 220 and 221 in portion 243 in region 214-1 to dielectrics 220 in portion 242 in region 214-1, and segment 219-2 couples alternating dielectrics 220 and 221 in portion 243 in region 214-2 to dielectrics 220 in portion 242 in region 214-2, as shown in FIG. 2J.

Termination structures 247 can prevent the removal material from the portions of region 202 corresponding to adjacent groups 218-1 and 218-2 from flowing into a bulk region 243 and removing dielectrics 221 there, which could provide a path for extraneous metal during a subsequent metal processing step. For example, the metal could cause an electrical short between access lines corresponding to group 218-1 and access lines corresponding to group 218-2 that can be formed from the metal.

Termination structures 247 can prevent the removal material from the portions of region 213 corresponding to adjacent sets 206-1 and 206-2 of contacts from flowing into a bulk region 243 and removing dielectrics 221 there, which could provide a path for extraneous metal during the metal processing step. For example, the metal could cause an electrical short between access lines corresponding to group 218-1 that could extend into the portion of region 213 corresponding to set 206-1 and access lines corresponding to group 218-2 that could extend into the portion of region 213 corresponding to set 206-2.

Termination structures 247 and segments 219 couple the alternating dielectrics 220 and 221 in bulk portions 243 to the alternating dielectrics 220 and 221 in portions 242 while dielectrics 221 are removed. As such, termination structures 247 and segments 219 couple alternating dielectrics 220 and 221 in regions 202 and 213 to alternating dielectrics 220 and 221 in the bulk portions 223 of regions 214-1 and 214-2 while dielectrics 221 are removed. These couplings can restrict movement of the semiconductor structures 205 that could occur while dielectrics 221 are removed. For example, the couplings can reduce the movement of the semiconductor structures relative to the movement of the semiconductor structures associated with transverse segments 112-1 and 112-2 in FIG. 1.

Figure 2K:
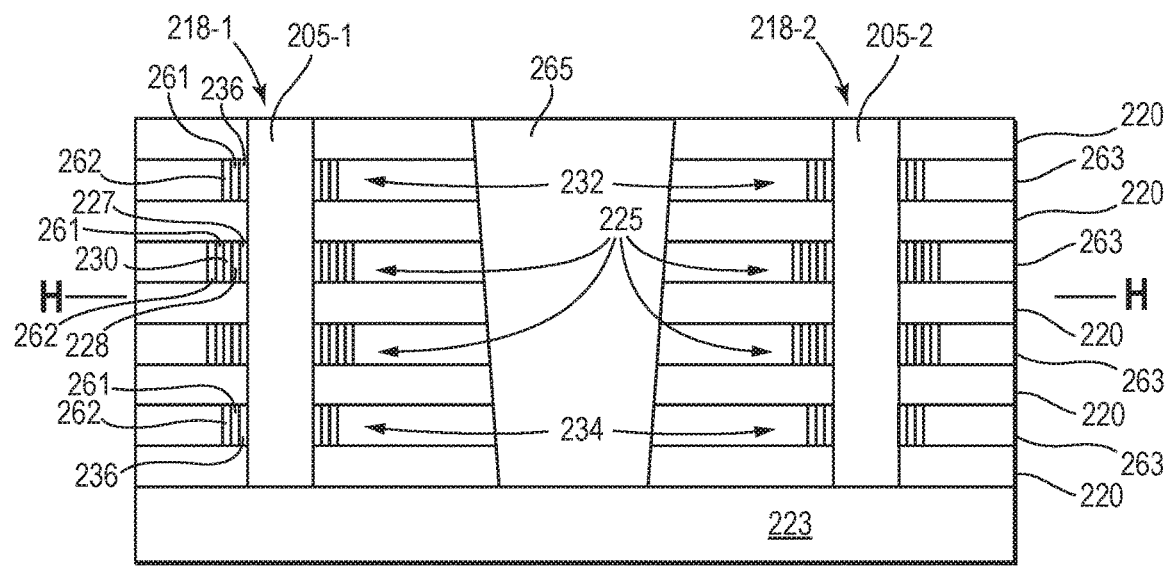
Figure 2L:
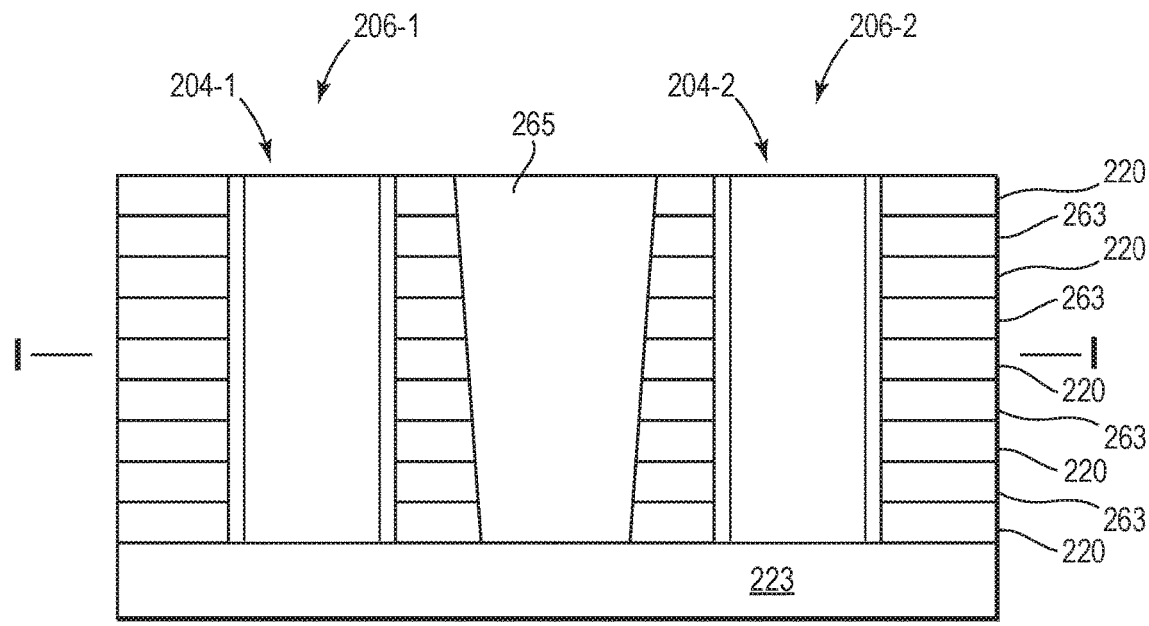
Figure 2M:
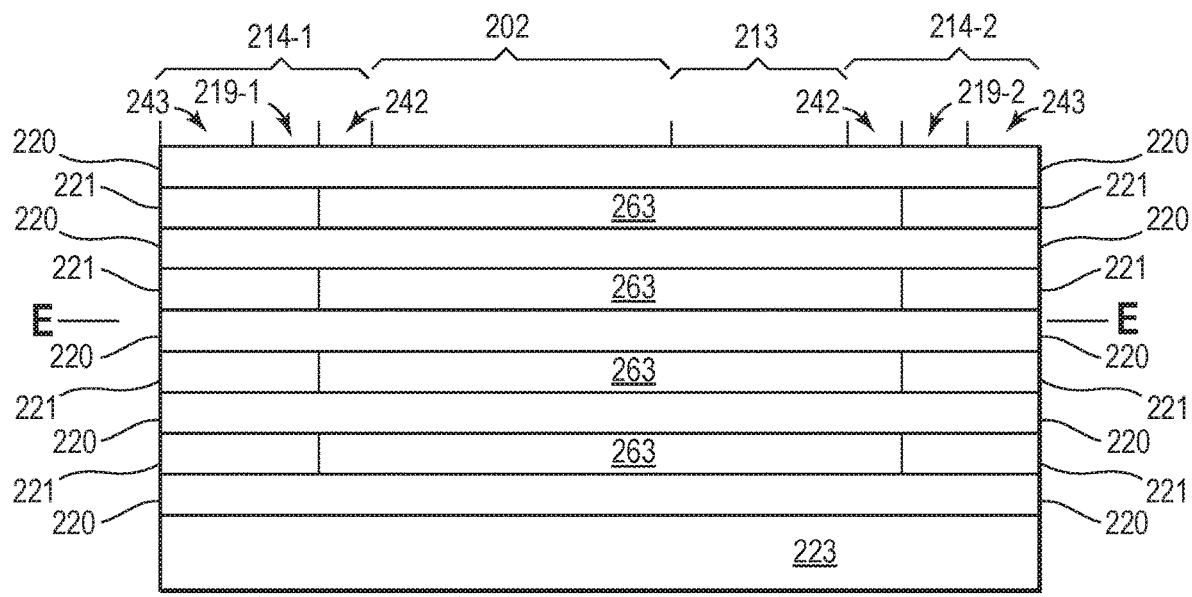

FIG. 2K is a cross-section viewed along line H-H in FIG. 2G, corresponding to a processing stage subsequent to the processing stage in FIG. 2H in accordance with a number of embodiments of the present disclosure. FIG. 2L is a cross-section viewed along line I-I in FIG. 2G, corresponding to a processing stage subsequent to the processing stage in FIG. 2I in accordance with a number of embodiments of the present disclosure. FIG. 2M is a cross-section viewed along line E-E in FIG. 2G, corresponding to a processing stage subsequent to the processing stage in FIG. 2J in accordance with a number of embodiments of the present disclosure.

The processing stage depicted in FIGS. 2K-2M can form a memory array, for example. In some examples, the openings 254 provide access to the spaces 258 in FIGS. 2H-2J to complete the formation of memory cells 225 and select transistors 232 and 234. For example, formation of memory cells 225 and select transistors 232 and 234 can be completed as part of a replacement gate process.

In some examples, a dielectric 261 can be supplied through openings 254 to form dielectric 261 in the spaces 258 adjacent to gate dielectrics 236 and blocking dielectrics 230, as shown in FIG. 2K. For example, dielectric 261 can be high-dielectric-constant (high-K) dielectric, such as alumina ($Al_2O_3$), hafnia ($HfO_2$), zirconia ($ZrO_2$), praeseodymium oxide ($Pr_2O_3$), hafnium tantalum oxynitride (HfTaON), hafnium silicon oxynitride (HfSiON), or the like. An interface metallic 262 (e.g., a barrier metal), such as tantalum nitride (TaN), titanaium nitride (TiN), or the like, can be supplied through openings 254 to form interface metallic 262 in the spaces 258 adjacent to dielectric 261, as shown in FIG. 2K.

Metal 263, such as tungsten, can be supplied through openings 254 to form metal 263 in the spaces 258 adjacent to interface metallic 262, as shown in FIG. 2K. For example, metal 263 can form lines, such as access lines that can include control gates of memory cells 225 and control lines that can include gates of select transistors 232 and 234. For example, metal 263 can be formed in the spaces 258 as part of a replacement gate process. In some examples, dielectric 261, interface metallic 262, and metal 263 can wrap completely around the corresponding semiconductor structures 205.

After the formation of metal 263 in spaces 258, termination structures 247 can couple stacks of dielectrics 220 alternating with dielectrics 221 in the bulk portions 243 of regions 214-1 and 214-2 to stacks of dielectrics 220 alternating with metal 263 in regions 202 and 213. As shown in FIG. 2M, segment 219-1 couples a stack of dielectrics 220 alternating with dielectrics 221 in the bulk portion 243 of region 214-1 to a stack of dielectrics 220 alternating with metal 263 in portion 242 of region 214-1, and segment 219-2 couples a stack of dielectrics 220 alternating with dielectrics 221 in the bulk portion 243 of region 214-2 to a stack of dielectrics 220 alternating with metal 263 in portion 242 of region 214-2. As such, segments 219 couple stacks of dielectrics 220 alternating with dielectrics 221 in the bulk portions 243 of regions 214-1 and 214-2 to stacks of dielectrics 220 alternating with metal 263 in regions 202 and 213. After the formation of metal 263 in spaces 258, dielectrics 265 (e.g., oxide) can be formed in openings 254 in regions 255-1 and 255-2. As such the respective dielectrics 265 can correspond to the respective openings 254, as shown in FIG. 2G.

In some examples, memory cells 225 can form a groups of series-coupled memory cells (e.g., a NAND strings) adjacent to semiconductor structures 205 and coupled in series with select transistors 232 and 234. Semiconductor 223 can be a source that can be selectively coupled to a group of series-coupled memory cells by a select transistor 234. A data line (not shown) can be coupled to an end of a semiconductor structure 205 opposite to semiconductor 223. For example, a select transistor 232 can selectively couple the data line to the group of series-coupled memory cells. The memory cells adjacent to semiconductor structures 205-1 can form a block of memory cells; the memory cells adjacent to semiconductor structures 205-2 can form a block of memory cells; and the memory cells adjacent to semiconductor structures 205-2 can form a block of memory cells. The alternating dielectrics 220 and dielectrics 221 in bulk portions 243 of regions 214-1 and 214-2 and dielectrics 265 electrically isolate the blocks of memory cells from each other.

Termination structures 247 and segments 219 couple the alternating dielectrics 220 and 221 in bulk portions 243 of regions 214-1 and 214-2 to dielectrics 220 in regions 202 and 213 while metal 263 is being formed in the spaces 258. These couplings can restrict movement of the semiconductor structures 205 that could occur while metal 263 is being formed in the spaces 258. For example, the coupling can reduce the movement of the semiconductor structures relative to the movement of the semiconductor structures associated with transverse segments 112-1 and 112-2 in FIG. 1. In some examples, the restricted movement of the semiconductor structures 205 can reduce the difficulties of aligning the data line contacts with the semiconductor structures associated with transverse segments 112-1 and 112-2. This can result in fewer "dummy" memory cells relative to the approach described in conjunction with FIG. 1, thus increasing the number of memory cells available to store data.

Termination structures 247 can be between stacks of dielectrics 220 alternating with dielectrics 221 in the bulk portions 243 of regions 214-1 and 214-2 and stacks of dielectrics 220 alternating with metal 263 (e.g., metal lines) in regions 202 and 213. For example, termination structures 247 can couple stacks of dielectrics 220 alternating with dielectrics 221 in the bulk portions 243 of regions 214-1 and 214-2 to stacks of dielectrics 220 alternating with metal 263 in regions 202 and 213.

As shown in FIG. 2M, segment 219-1 is between the alternating dielectrics 220 and 221 in the bulk portion 243 of region 214-1 and the dielectrics 220 alternating with metal 263 in region 202, and segment 219-2 is between the alternating dielectrics 220 and 221 in the bulk portion 243 of region 214-2 and the dielectrics 220 alternating with metal 263 in region 213. For example, segment 219-1 couples the alternating dielectrics 220 and 221 in the bulk portion 243 of region 214-1 to the dielectrics 220 alternating with metal 263 in region 202, and segment 219-2 couples the alternating dielectrics 220 and 221 in the bulk portion 243 of region 214-2 to the dielectrics 220 alternating with metal 263 in region 213.

Sets 206-1 to 206-3 of contacts pass through dielectrics 220 alternating with metal 263 in region 213, as shown in FIG. 2L for sets 206-1 and 206-2. A dielectric 265 can be in region 255-1 between sets 206-1 and 206-2 and between blocks of memory cells corresponding to semiconductor structures 218-1 and 218-2, as shown in FIG. 2G, and pass through the stack of dielectrics 220 alternating with metal 263 in regions 202 and 213, as shown in FIGS. 2K and 2L. A dielectric 265 can be in region 255-2 between sets 206-2 and 206-3 and between blocks of memory cells corresponding to semiconductor structures 218-2 and 218-3 and pass through the stack of dielectrics 220 alternating with metal 263 in regions 202 and 213. A dielectric 265 can be between and terminate at (e.g., can be coupled to) termination structure 247-1 (e.g., the dielectric liner 248 of termination structure 247-1) in region 214-1 and termination structure 247-3 in region 214-2 (e.g., the dielectric liner 248 of termination structure 247-3), as shown in FIG. 2G, and a dielectric 265 can be between and terminate at (e.g., can be coupled to) termination structure 247-2 in region 214-1 and termination structure 247-4 in region 214-2. Note that the long sides of a termination structure 247 are transverse to a respective dielectric 265 so that the respective dielectric 265 terminates at one of the long sides, as shown in FIG. 2G.

FIG. 3 illustrates a termination structure in accordance with a number of embodiments of the present disclosure. For example, FIG. 3 illustrates a termination structure 347. The termination structures 247 shown in FIG. 2F can have a shape such as termination structure 347. Termination structure 347 has a rectangular portion 366 that is transverse to an opening 354 that can be one of the openings 254 and that can be filled with a dielectric 365 that can be one of the dielectrics 265. For example, opening 354/dielectric 365 can terminate at (e.g., can be coupled to) rectangular portion 366.

Two prongs 367 can be contiguous to rectangular portion 366, can be parallel to opening 354/dielectric 365, and can extend away from rectangular portion 366 in a direction opposite to the direction from which opening 354/dielectric 365 extends from rectangular portion 366. Termination structure 347 can be bisected by and be symmetric about an extension of a longitudinal central axis 368 of opening 354/dielectric 365. In some examples, termination structure 347 can be referred to as a U-shaped termination structure. The presence of prongs 367 can provide improved electrical isolation by preventing removal material in opening 354 from flowing around termination structure 347 and forming a path for extraneous metal could cause an electrical short between access lines formed from the metal on either side of opening 354, such as between access lines corresponding to group 218-1 and access lines corresponding to group 218-2 in FIG. 2G.

FIG. 4 illustrates another termination structure in accordance with a number of embodiments of the present disclosure. For example, FIG. 4 illustrates a termination structure 447. Each termination structure 247 can be replaced by a respective termination structure 447. Termination structure 447 has an inverted V-shaped surface 469 between and contiguous to opposing end surfaces 470 and an opposing V-shaped surface 471 between and contiguous to the opposing end surfaces 470. An opening 454 that can be one of the dielectrics 254 and that can be filled with a dielectric 465 that can be one of the dielectrics 265 can terminate at (e.g., can be coupled to) inverted V-shaped surface 469. For example, opening 454/dielectric 465 can terminate at inverted V-shaped surface 469 adjacent to a peak of the inverted V-shaped surface 469. Inverted V-shaped surface 469 can provide improved electrical isolation by preventing removal material in opening 454 from flowing around termination structure 447 and forming a path for extraneous metal could cause an electrical short between access lines formed from the metal on either side of opening 454, such as between access lines corresponding to group 218-1 and access lines corresponding to group 218-2 in FIG. 2G.

The opposing end surfaces 470 can be parallel to opening 454/dielectric 465. Termination structure 447 can be bisected by and be symmetric about and extension of a longitudinal central axis 472 of opening 454/dielectric 465. In some examples, termination structure 447 can be referred to as a bow-tie-shaped termination structure.

Figure 5A:
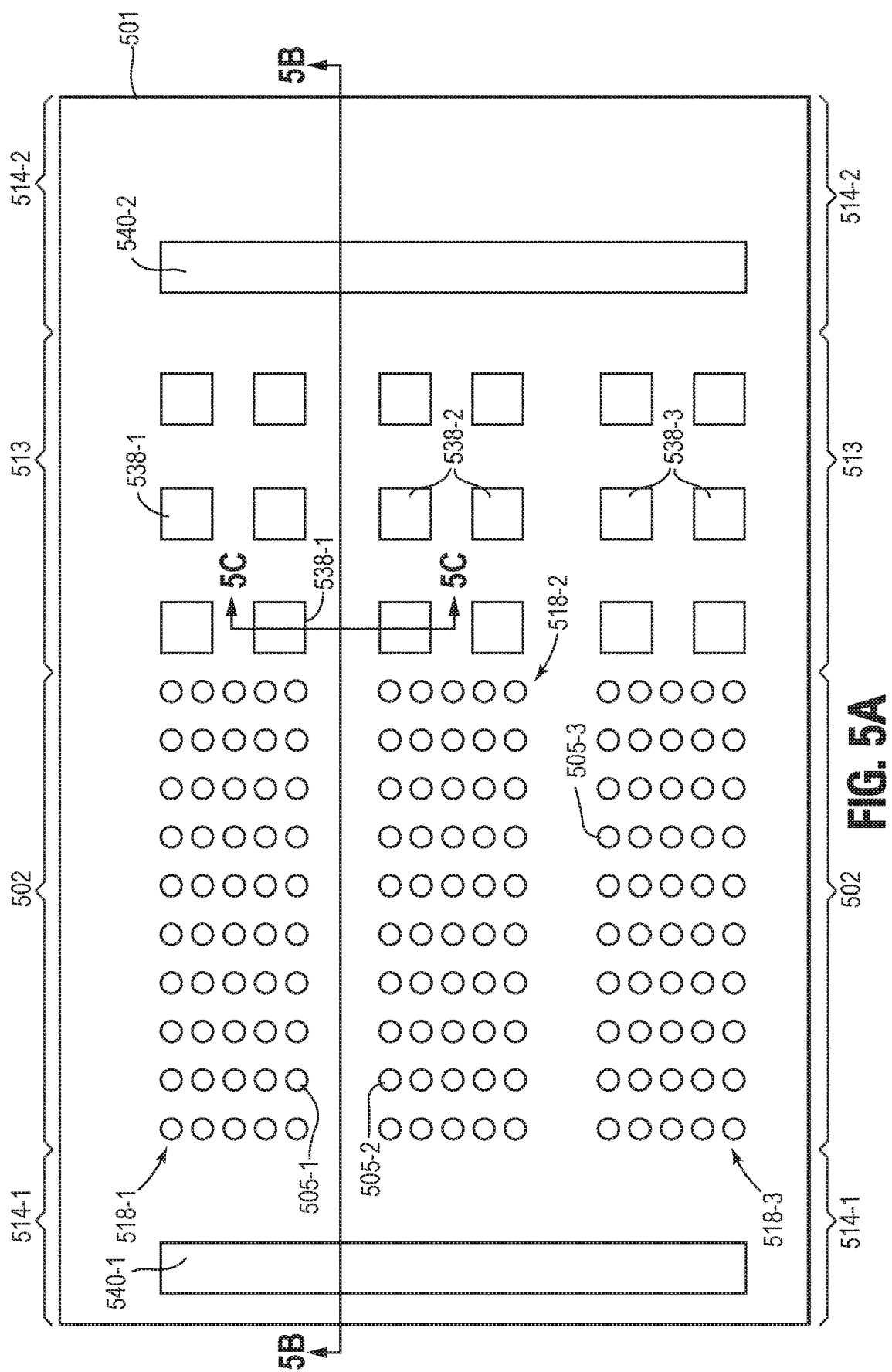
FIGS. 5A to 5H are various views corresponding to particular stages of processing associated with forming a stacked memory array in accordance with a number of embodiments of the present disclosure.
Figure 5B:
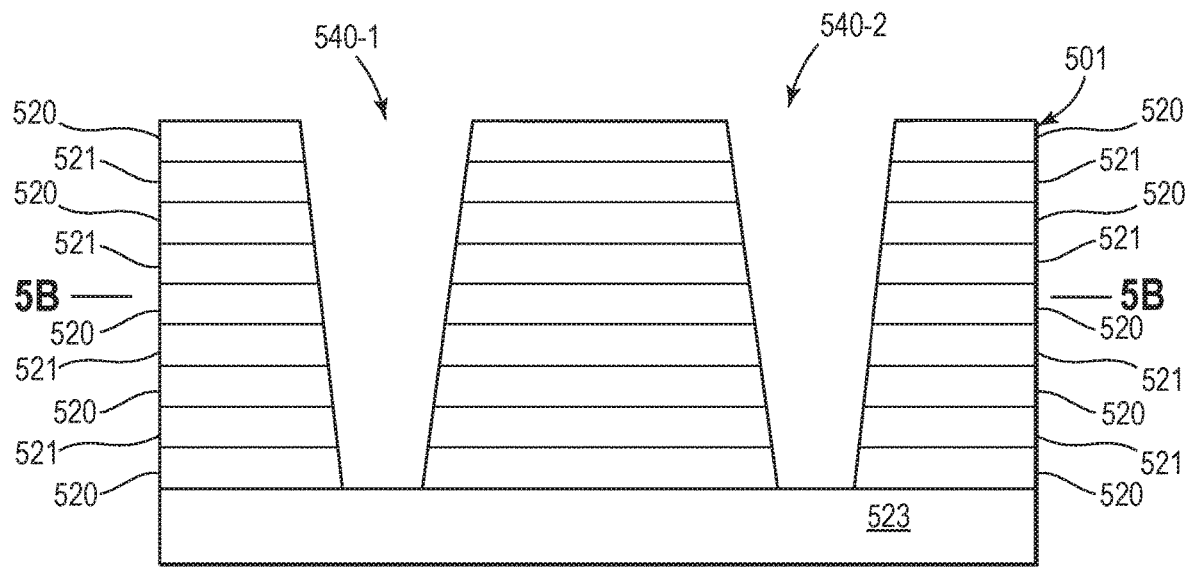
Figure 5C:
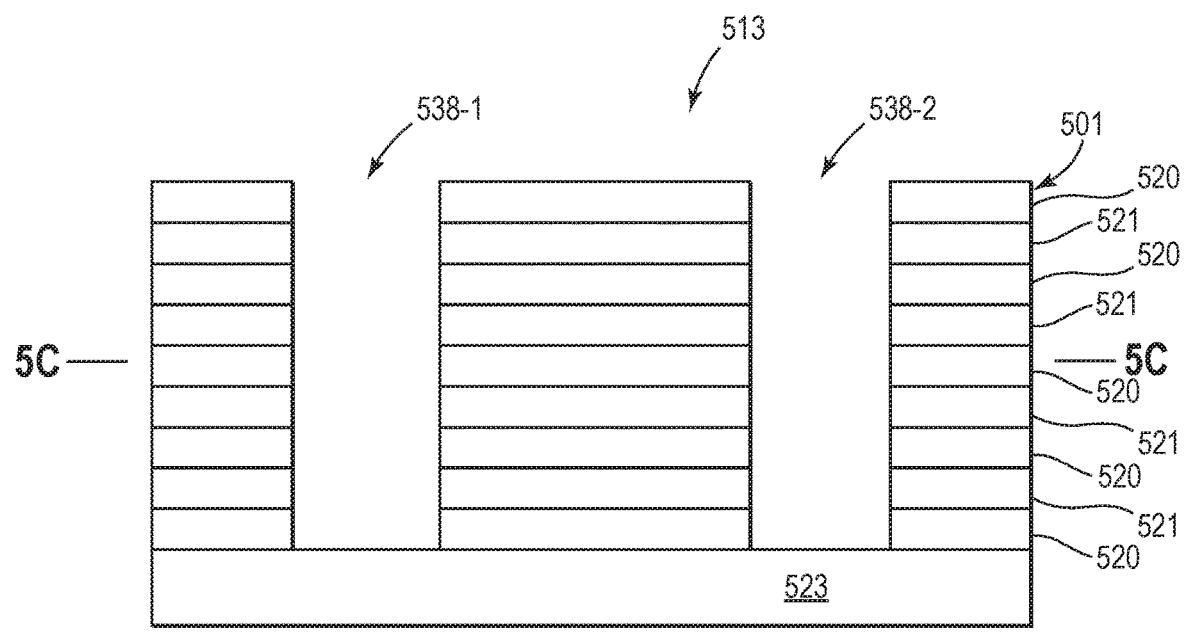

FIG. 5A is a top view corresponding to a particular stage of processing associated with forming a stacked memory array in accordance with a number of embodiments of the present disclosure. In some examples, the array can be a three-dimensional NAND memory array. FIG. 5B is a cross-section viewed along line 5B-5B in FIG. 5A during the processing stage in FIG. 5A in accordance with a number of embodiments of the present disclosure. FIG. 5C is a cross-section viewed along line 5C-5C in FIG. 5A during the processing stage in FIG. 5A in accordance with a number of embodiments of the present disclosure. FIGS. 5A-5C can correspond to a processing stage that can occur after a number of processing stages have occurred.

As shown in FIGS. 5A and 5C, sets of openings 538-1 to 538-3 (e.g., contact openings) are formed (e.g., etched) through a stack 501 of alternating dielectrics 520 and 521 formed on a semiconductor 523 in a region 513, such as a contact region, of stack 501, stopping at an upper surface of or in a semiconductor 523. As shown in FIGS. 5A and 5B, openings 540 (e.g., openings 540-1 to 540-2) are formed (e.g., etched) through stack 501 concurrently with forming openings 538-1 to 538-3, stopping at the upper surface of or in semiconductor 523. For example, opening 540-1 can be formed through stack 501 in a region 514-1 of stack 501 adjacent to a region 502, such as a memory-cell region, and opening 540-2 can be formed through stack 501 in a region 514-2 of stack 501 adjacent to region 513.

Respective groups 518-1 to 518-3 of respective semiconductor structures 505-1 to 505-3 pass through region 502 of stack 501 and can be formed before openings 538 and 540 are formed. In some examples, groups 518-1 to 518-3 can correspond to blocks of memory cells that are to be formed in region 502. Semiconductor structures 505-1 to 505-3 and semiconductor 523 can be as described previously for semiconductor structures 205-1 to 205-3 and semiconductor 223. Dielectrics 520 and 521 can be as described previously for dielectrics 220 and 221.

In some examples, select transistors that can be similar to (e.g., the same as) select transistors 232 and 234 can be respectively partially formed adjacent to semiconductor structures 505 at levels in stack 501 corresponding to the uppermost and lowermost dielectrics 521 before openings 538 and 540 are formed. Memory cells that can be similar to (e.g., the same as) memory cells 225 can be respectively partially formed adjacent to semiconductor structures 505 at levels in stack 501 corresponding to dielectrics 521 between the uppermost and lowermost dielectrics 521 before openings 538 and 540 are formed.

In some examples, stack 501 can include a stair-step structure (not shown in FIG. 5A) adjacent to region 514-1 and/or region 514-2. Respective steps of the stair-step structure can be at different levels in stack 501. Each step of the stair-step structure can include a dielectric 521 over a dielectric 520, for example.

Figure 5D:
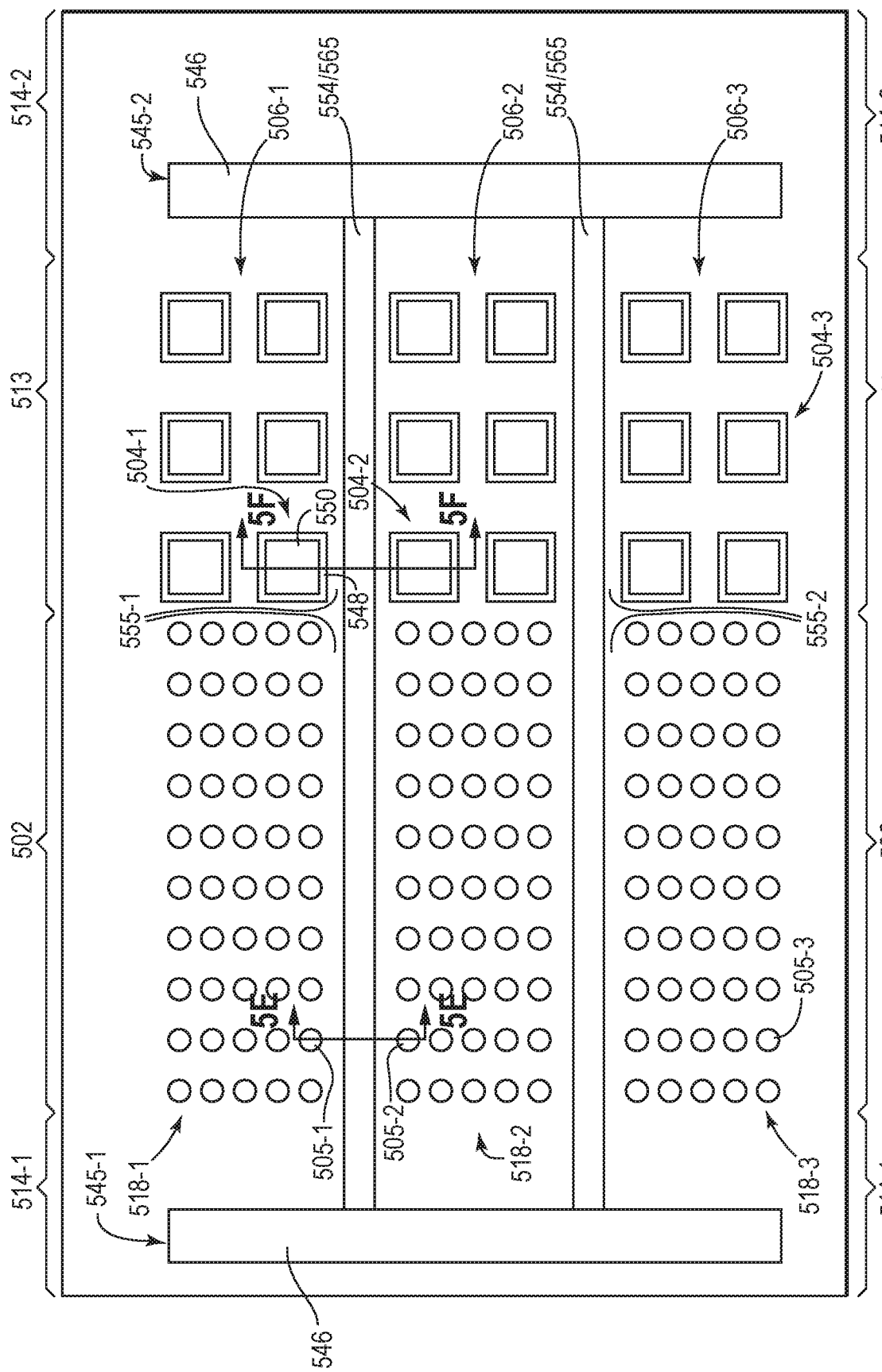

FIG. 5D is a top view corresponding to a stage of processing following the stage of processing of FIG. 5A in accordance with a number of embodiments of the present disclosure. During the processing stage of FIG. 5D, sets 506-1 to 506-3 of contacts 504-1 to 504-3 are formed through stack 501 in region 513 and termination structures 545-1 and 545-2 are respectively formed through stack 501 in regions 514-1 and 514-2. For example, the contacts 504-1 to 505-3 are respectively formed in the openings 538-1 to 538-3, and termination structures 545-1 and 545-2 are respectively formed in openings 540-1 and 540-2.

Termination structures 545-1 and 545-2 can be formed by forming a dielectric 546, such as oxide, in openings 540-1 and 540-2. In some examples, forming contacts 504 can include forming dielectric liners 548, such as oxide liners, in openings 538. Metal 550, such as tungsten, is formed in the openings lined with the dielectric liners 548 adjacent to dielectric liners 548, so that the dielectric liners 548 surround metal 550. Termination structures 545 can be formed before or after contacts 504. In some examples, dielectric 546 of termination structures 545 can be formed concurrently with forming dielectric liners 548.

After forming contacts 504 and termination structures 545, an opening 554 is formed through stack 501 in a region 555-1 between the sets 506-1 and 506-2 of contacts and between the groups 518-1 and 518-2 of semiconductor structures, and an opening 554 is formed in a region 555-2 between the sets 506-2 and 506-3 of contacts and between the groups 518-2 and 518-3 of semiconductor structures. Openings 554 are between and terminate at termination structures 545-1 and 545-2. Openings 554 can pass through stack 501 and stop at an upper surface of or in semiconductor 523. Openings 554 can be formed as part of a replacement gate process in some examples.

Note that openings 554 are analogous to the segments 110 of opening 108 in FIG. 1, and openings 540-1 and 540-2 are analogous to segments 112-1 and 112-2 of opening 108. Forming openings 540 concurrently with forming contact openings 538 before forming contacts 504 and forming termination structures 545 before forming openings 554 can reduce the amount of movement of the semiconductor structures 505 relative to the movement of the semiconductor structures 105 associated with forming segments 110 of opening 108 and segments 112-1 and 112-2 concurrently in a single step after forming the contacts. For example, the movement in a direction parallel to openings 554 can be about 60 percent less than the movement in a direction parallel to segments 110 in FIG. 1. Moreover, forming openings 554 after forming termination structures 545 can avoid the difficulties associated with forming the T-intersections between segments 110 and segments 112-1 and 112-2 that occur when forming opening 108 during a single etch.

Figure 5E:
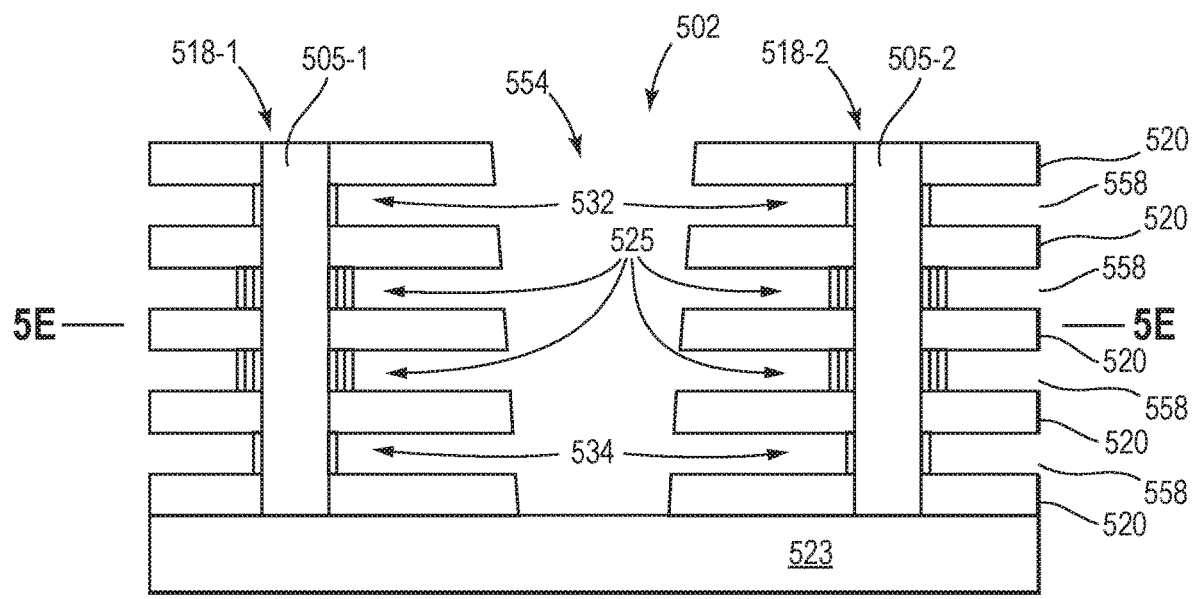
Figure 5F:
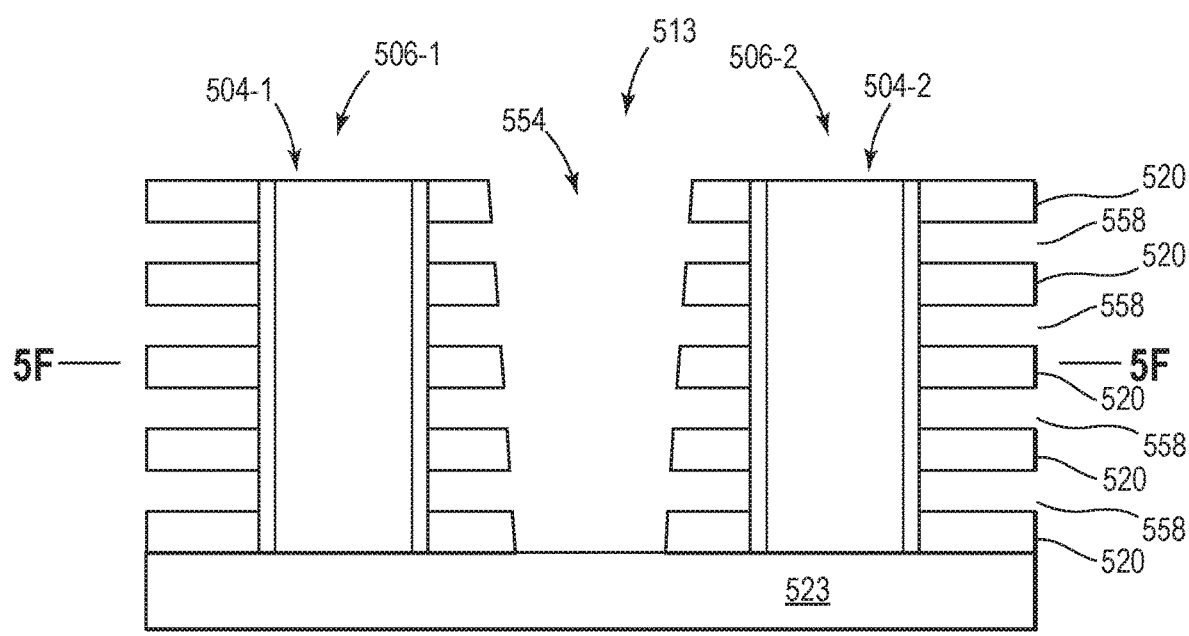

FIG. 5E is a cross-section viewed along line 5E-5E in FIG. 5D corresponding to a processing step of the processing stage of FIG. 5D in accordance with a number of embodiments of the present disclosure. FIG. 5F is a cross-section viewed along line 5F-5F in FIG. 5D corresponding to the processing step of FIG. 5E in accordance with a number of embodiments of the present disclosure.

Openings 554 can provide access to dielectrics 521 for the removal of dielectrics 521. For example, dielectrics 521 can be removed as part of a replacement gate process. A removal material, such as a wet etchant, can be supplied through openings 554 to remove dielectrics 521 to form a stack of dielectrics 520 alternating with spaces 558 in region 502, as shown in FIGS. 5E and 5F. The uppermost and lowermost spaces 558 can respectively expose partially formed select transistors 532 and 534 that can be similar to (e.g., the same as) partially formed select transistors 232 and 234, as previously described in conjunction with FIG. 2C. The spaces 558 between the uppermost and lowermost spaces 258 expose partially formed memory cells 525 that can be similar to (e.g., the same as) partially formed memory cells 225, as previously described in conjunction with FIG. 2C. Semiconductor structures 505-1 and 505-2 pass through the stack of dielectrics 520 alternating with spaces 558 in region 502. Contacts 504-1 and 504-2 pass through the stack of dielectrics 520 alternating with spaces 558 in region 513, as shown in FIG. 5F.

Figure 5G:
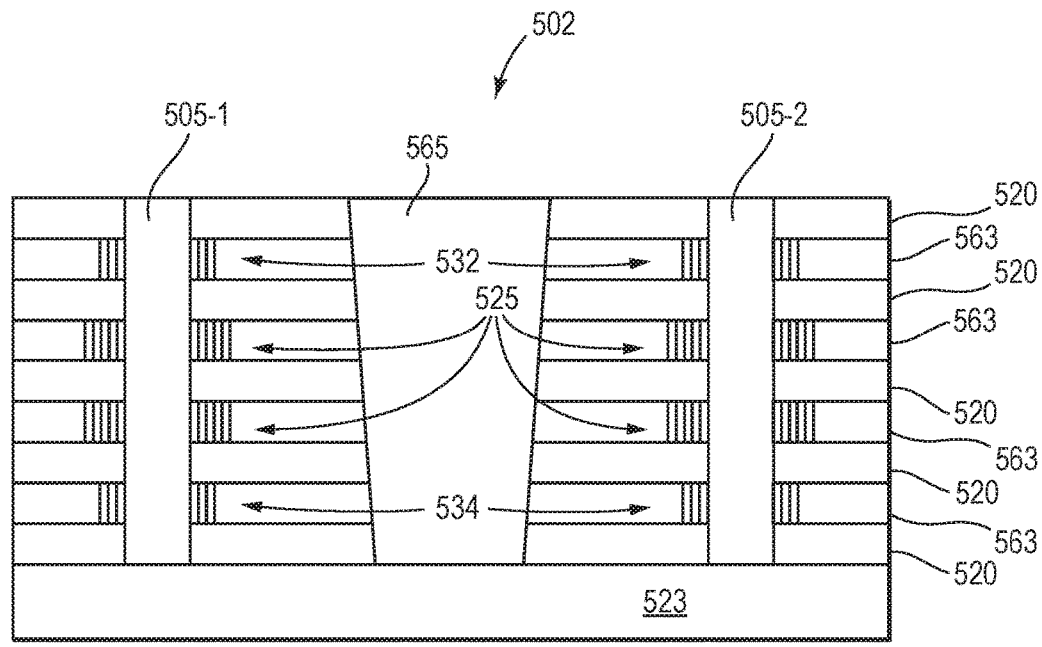
Figure 5H:
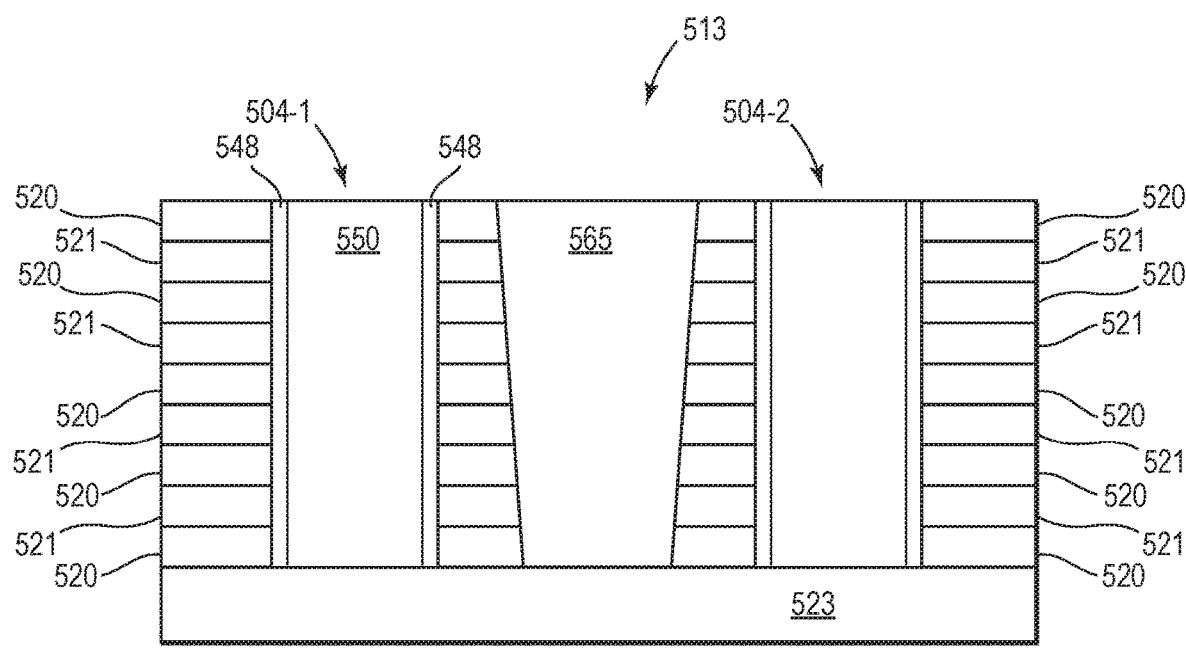

FIG. 5G is a cross-section corresponding to the cross-section of FIG. 5E corresponding to a processing step after the processing step corresponding to FIG. 5E in accordance with a number of embodiments of the present disclosure. FIG. 5H is a cross-section corresponding to the cross-section of FIG. 5F corresponding to a processing step after the processing step corresponding to FIG. 5F in accordance with a number of embodiments of the present disclosure.

The processing step depicted in FIGS. 5G and 5H can form a memory array, for example. In some examples, the openings 554 in FIGS. 5D-5F provide access to the spaces 558 in FIGS. 5E and 5F to complete the formation of memory cells 525 and select transistors 532 and 534. For example, formation of memory cells 525 and select transistors 532 and 534 can be completed as part of a replacement gate process. Completed memory cells 525 can be similar to (e.g., the same as) completed memory cells 225, as previously described in conjunction with FIG. 2K. Completed select transistors 532 and 534 can be similar to (e.g., the same as) completed select transistors 532 and 534, as previously described in conjunction FIG. 2K.

Metal 563 can be supplied through openings 554 to form metal 563 in the spaces 558. For example, metal 563 can form lines, such as access lines that can include control gates of memory cells 525 and control lines that can include control gates of select transistors 532 and 534. For example, metal 563 can be formed in the spaces 558 as part of a replacement gate process.

Sets 506 of contacts pass through dielectrics 520 alternating with metal 563 in region 513, as shown in FIG. 5H for sets 506-1 and 506-2. Semiconductor structures 505 with memory cells 525 and select transistors 532 and 534 adjacent thereto pass through dielectrics 520 alternating with metal 563 in region 502, as shown in FIG. 5G for semiconductor structures 505-1 and 505-2.

After the formation of metal 563 in spaces 558, a dielectric 565 (e.g., oxide) can be formed in opening 554 in region 555-1 and in opening 554-2 in region 555-2. Dielectrics 565 can be between, terminate at, and coupled to termination structures 545-1 and 545-2, as shown in FIG. 5G.

Figure 6:
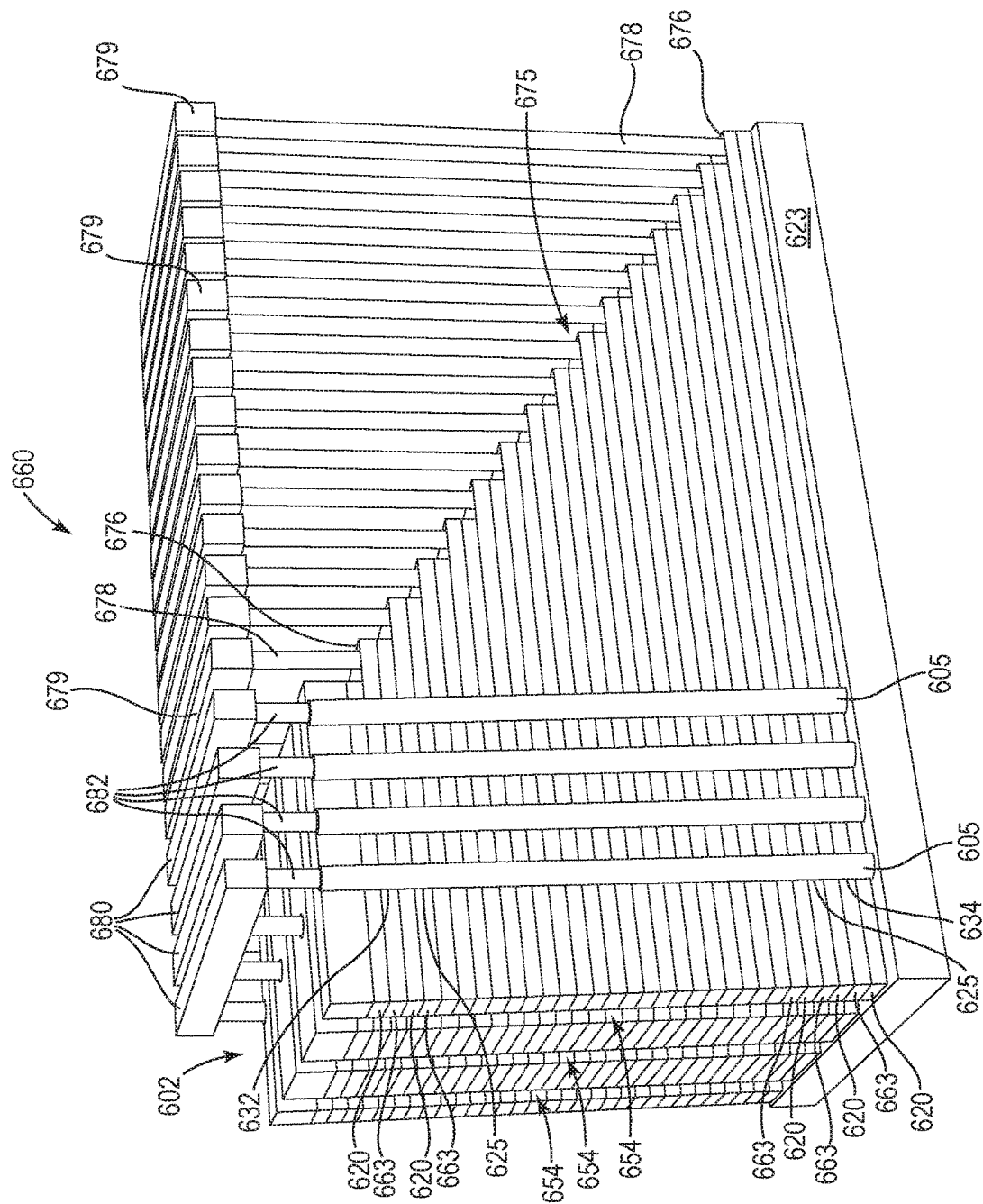
FIG. 6 illustrates a stacked memory array in accordance a number of embodiments of the present disclosure.

FIG. 6 illustrates a stacked memory array, such as stacked memory array 660, in accordance a number of embodiments of the present disclosure. For example, array 660 can include a region 602 (e.g., a memory-cell region) that can correspond to region 202 or 502. Array 660 includes a stair-step structure 675 adjacent to region 602.

Array 660 can include a stack of dielectrics 620 alternating with levels of metal 663. Semiconductor structures 605 pass through the stack in region 602 and terminate at an upper surface of or in a semiconductor 623. A select transistor 632 can be adjacent to each semiconductor structure 605 at a level corresponding to the uppermost level of metal 663, and a select transistor 634 can be adjacent to each semiconductor structure 605 at a level corresponding to the lowermost level of metal 663. Memory cells 625 can be adjacent to each semiconductor structure 605 at levels corresponding to the levels of metal 663 between the uppermost and lowermost levels of metal 663. For example, semiconductor structures 605, dielectrics 620, semiconductor 623, and metal 663 can be as previously described for semiconductor structures 205, dielectrics 220, semiconductor 223, and metal 263, respectively.

The uppermost and lowermost levels of metal 663 can be control lines that form or are coupled to control gates of select transistors 632 and 634, respectively. The levels of metal 663 between the uppermost and lowermost levels of metal 663 can be access lines that form or are coupled to control gates of memory cells 625.

Stair-step structure 675 includes steps 676 that can each include a respective level of metal 663 over an adjacent dielectric 620. A respective contact 678 is coupled to the level of metal 663 of each respective step 676. Respective contacts 678 are coupled to activation (e.g., access) circuitry by respective lines 679. Data lines 680 are coupled to semiconductor structures 605 by data line contacts 682.

Openings 650 are formed through the stack. Openings 650 can be as previously described for openings 250 and 550. Openings 650 can terminate at termination structures in a manner similar to (e.g., the same as) as previously described for openings 250 and 550.

Figure 7:
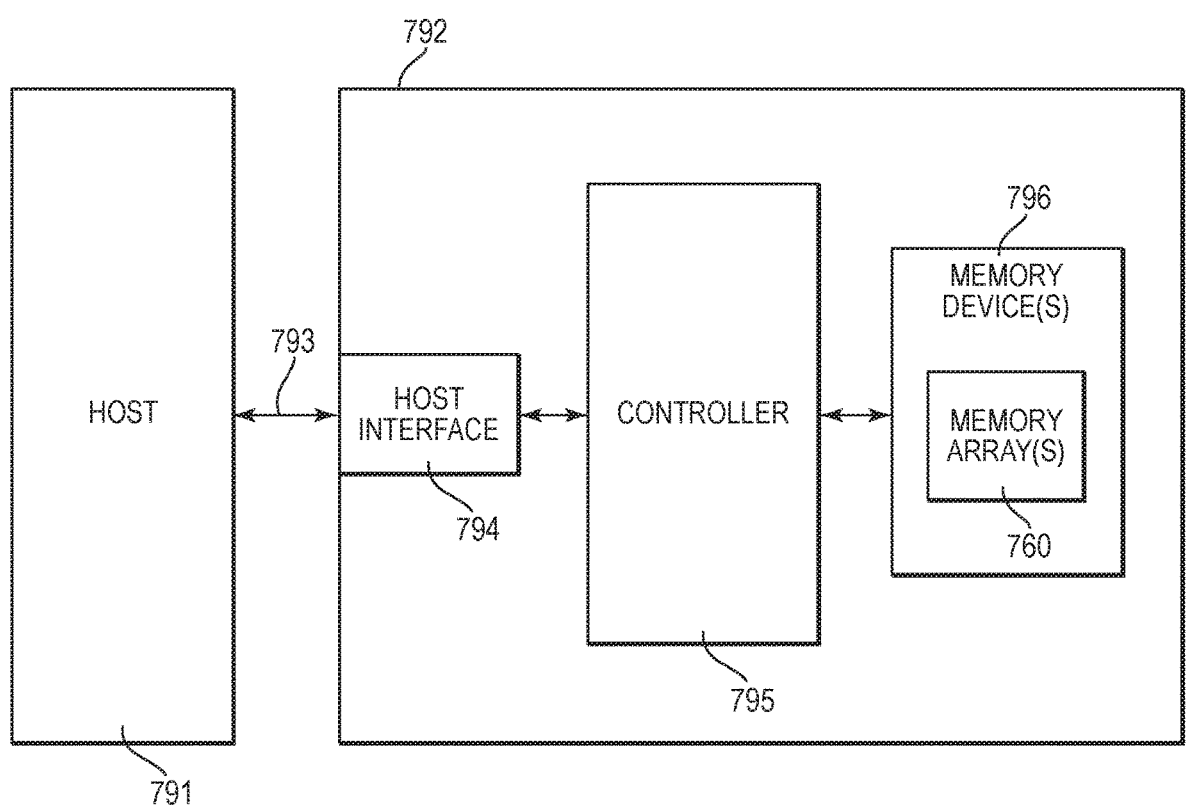
FIG. 7 is a block diagram of an apparatus in accordance a number of embodiments of the present disclosure.

FIG. 7 is a block diagram of an apparatus in accordance a number of embodiments of the present disclosure. For example, the apparatus can be an electronic system, such as a computing system 790. Computing system 790 can include a memory system 792 that can be a solid-state drive (SSD), for instance. Memory system 792 can include a host interface 794, a controller 795, such as a processor and/or other control circuitry, and a number of memory devices 796, such as NAND flash devices, that provide a storage volume for the memory system 792. A memory device 796 can have a number of memory arrays 760, such as memory array 660 shown in FIG. 6.

Controller 795 can be coupled to the host interface 794 and to the number of memory devices 796 via one or more channels and can be used to transfer data between the memory system 792 and a host 791. Host 791 can be coupled to the host interface 794 by a communication channel 793. Host 791 can be a host system such as a personal laptop computer, a desktop computer, a digital camera, a mobile telephone, or a memory card reader, among various other types of hosts.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

As used herein, "a number of" something can refer to one or more of such things. For example, a number of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship). It should be recognized the term parallel takes into account variations from "exactly" parallel due to routine manufacturing and/or assembly variations.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method of forming a stacked memory array, comprising:
   forming a stack of alternating first and second dielectrics;
   forming a termination structure passing through a first region of the stack;
   forming first and second sets of contacts through a second region of the stack concurrently with forming the termination structure;
   forming an opening through the stack between the first and second sets of contacts so that the opening terminates at the termination structure; and
   removing the first dielectrics from the second region by accessing the first dielectrics through the opening so that the first and second sets of contacts pass through the second dielectrics alternating with spaces corresponding to the removed first dielectrics forming a stack of alternating first and second dielectrics.

2. The method of claim 1, wherein the termination structure couples the alternating first and second dielectrics in the first region of the stack to the second dielectrics in the second region while removing the first dielectrics from the second region.

3. The method of claim 1, further comprising supplying metal through the opening to form levels of the metal in the spaces so that the first and second sets of contacts pass through the second dielectrics alternating with levels of the metal.

4. The method of claim 3, wherein the levels of the metal comprise access lines coupled to memory cells.

5. The method of claim 3, wherein
   forming the opening further comprises forming the opening through the alternating first and second dielectrics in a region between first and second groups of semiconductor pillars passing through the alternating first and second dielectrics in a third region of the stack;

removing the first dielectrics removes the first dielectrics from the third region of the stack so that the first and second groups of semiconductor pillars pass through the second dielectrics alternating with spaces corresponding to the removed first dielectrics from the third region; and supplying metal through the opening forms levels of the metal in the spaces corresponding to the removed first dielectrics from the third region so that the first and second groups of semiconductor pillars pass through dielectrics alternating with the levels of the metal.

6. The method of claim 3, further comprising forming a fourth dielectric in the opening after forming the metal in the spaces so that the fourth dielectric is coupled to the termination structure.

7. The method of claim 1, wherein the opening is a first opening and wherein forming the termination structure comprises:

forming a second opening passing through the first region of the stack;

lining the second opening with a dielectric liner; and forming metal in the second opening lined with the dielectric liner adjacent to the dielectric liner.

8. The method of claim 7, wherein the first opening terminates at the dielectric liner.

9. The method of claim 7, wherein forming the termination structure further comprises:

removing the metal from the second opening; and forming a third dielectric in the second opening adjacent to the dielectric liner.

10. The method of claim 1, wherein the termination structure is rectangular and is transverse to the opening.

11. The method of claim 1, wherein the termination structure comprises:

a rectangular portion that is transverse to the opening; and two prongs contiguous to the rectangular portion, parallel to the opening, and extending away from the rectangular portion in a direction opposite to a direction from which the opening extends from the rectangular portion.

12. The method of claim 1, wherein the termination structure comprises an inverted V-shaped surface between and contiguous to opposing end surfaces and an opposing V-shaped surface between and contiguous to the opposing end surfaces;

the opening terminates at the inverted V-shaped surface adjacent to a peak of the inverted V-shaped surface; and the opposing end surfaces are parallel to the opening.

13. A method of forming a stacked memory array, comprising:

forming a stack of alternating first and second dielectrics;

forming first and second openings through a first region of the stack so that a segment of the stack separates the first opening from the second opening;

forming a set of contact openings through a second region of the stack concurrently with forming the first and second openings;

forming first and second termination structures respectively in the first and second openings;

forming a set of contacts in the contact openings concurrently with forming the first and second termination structures; and forming second and third openings through the stack while the segment couples the alternating first and second dielectrics in the first region to the alternating first and second dielectrics in the first region;

wherein the second and third openings respectively terminate at the first and second termination structures and the set of contacts is between the second and third openings.

14. The method of claim 13, further comprising:

removing the first dielectrics from the second region by accessing the first dielectrics through the second and third openings so that the second dielectrics alternate with spaces corresponding to the removed first dielectrics;

wherein the second dielectrics of the segment are coupled to the second dielectrics in second region while removing the first dielectrics from the second region.

15. The method of claim 14, further comprising:

supplying metal through the second and third openings to form levels of the metal in the spaces so that the set of contacts passes through the second dielectrics alternating with levels of the metal in the second region;

wherein the second dielectrics of the segment are coupled to the second dielectrics in second region while supplying the metal through the second and third openings.

16. A method of forming a stacked memory array, comprising:

forming a stack of alternating first and second dielectrics;

forming a first opening through a first region of the stack;

forming a set of contact openings through a second region of the stack concurrently with forming the first opening;

forming a set of contacts in the contact openings;

forming a termination structure in the first opening;

forming second and third openings through the stack so that the second and third openings terminate at the termination structure and the set of contacts is between the second and third openings; and removing the first dielectrics from the second region by accessing the first dielectrics through the second and third openings so that the second dielectrics alternate with spaces corresponding to the removed first dielectrics.

17. The method of claim 16, wherein forming the second and third openings further comprises forming the second and third openings so that a group of semiconductor structures passing through the alternating first and second dielectrics in a third region of the stack is between the second and third openings; and removing the first dielectrics removes the first dielectrics from the third region of the stack so that the group of semiconductor pillars passes through the second dielectrics alternating with spaces corresponding to the removed first dielectrics from the third region.

18. The method of claim 17, further comprising:

supplying metal through the second and third openings to form levels of the metal in the spaces corresponding to the first dielectrics removed from the second and third regions so that the set of contacts passes through the second dielectrics alternating with the levels of the metal and the group of semiconductor pillars passes through the second dielectrics alternating with the levels of the metal.

19. The method of claim 16, further comprising forming respective third dielectrics in the second and third openings so that the respective third dielectrics terminate at the termination structure.

20. A stacked memory array, comprising:

a first termination structure;

a second termination structure;

a stack of respective first dielectrics alternating with respective second dielectrics between the first and second termination structures;

a third dielectric coupled to the first termination structure;

a fourth dielectric coupled to the second termination structure; and a number of stacks of memory cells between the third dielectric and the fourth dielectric;

wherein memory cells at respective levels in the stacks of memory cells are coupled to respective access lines; and wherein the respective access lines are coupled to the respective first dielectrics of the stack of respective first dielectrics alternating with respective second dielectrics.

21. The stacked memory array of claim 20, wherein the access lines alternate with third dielectrics that are coupled to the second dielectrics.

22. The stacked memory array of claim 21, further comprising a set of contacts between the third dielectric and the fourth dielectric and passing through the access lines alternating with third dielectrics.

23. The stacked memory array of claim 20, wherein
the first and second termination structures each comprise metal and a fifth dielectric around the metal; and
the third and fourth dielectrics respectively terminate at the fifth dielectric of the first and second termination structures.

24. The stacked memory array of claim 20, wherein the first and second termination structures are dielectrics.

* * * * *